United States Patent
Huang et al.

(10) Patent No.: US 9,656,857 B2
(45) Date of Patent: May 23, 2017

(54) MICROELECTROMECHANICAL SYSTEMS (MEMS) DEVICES AT DIFFERENT PRESSURES

(71) Applicant: Taiwan Semiconductor Manufacturing Co., Ltd., Hsin-Chu (TW)

(72) Inventors: Hsin-Ting Huang, Bade (TW); Hsiang-Fu Chen, Zhubei (TW); Wen-Chuan Tai, Hsinchu (TW); Shao-Chi Yu, Hsinchu (TW); Chia-Ming Hung, Taipei (TW); Allen Timothy Chang, Hsinchu (TW); Bruce C. S. Chou, Hsin Chu (TW); Chin-Min Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 53 days.

(21) Appl. No.: 14/557,513

(22) Filed: Dec. 2, 2014

(65) Prior Publication Data

US 2016/0130137 A1    May 12, 2016

Related U.S. Application Data

(60) Provisional application No. 62/076,579, filed on Nov. 7, 2014.

(51) Int. Cl.
*B81B 7/02*    (2006.01)

(52) U.S. Cl.
CPC ........ *B81B 7/02* (2013.01); *B81B 2201/0235* (2013.01); *B81B 2201/0242* (2013.01); *B81B 2207/095* (2013.01); *B81C 2203/0145* (2013.01)

(58) Field of Classification Search
CPC .... B81B 2201/0235; B81B 2201/0242; B81B 2207/095
(Continued)

(56) References Cited

U.S. PATENT DOCUMENTS 7,659,150 B1    2/2010   Monadgemi et al.
8,580,594 B2    11/2013  Huang et al.
(Continued)

FOREIGN PATENT DOCUMENTS

CN    101643193 A    2/2010
WO    2013064632 A1  5/2013

OTHER PUBLICATIONS

Martin Tarr, "Hermatic Encapsulation," Website, 2009, Figure 1, http://www.mtarr.co.uk/courses/topics/0261_herm/index.html#top.
(Continued)

*Primary Examiner* — Errol Fernandes
(74) *Attorney, Agent, or Firm* — Eschweiler & Potashnik, LLC

(57) ABSTRACT

Some embodiments relate to multiple MEMS devices that are integrated together on a single substrate. A device substrate comprising first and second micro-electro mechanical system (MEMS) devices is bonded to a capping structure. The capping structure comprises a first cavity arranged over the first MEMS device and a second cavity arranged over the second MEMS device. The first cavity is filled with a first gas at a first gas pressure. The second cavity is filled with a second gas at a second gas pressure, which is different from the first gas pressure. A recess is arranged within a lower surface of the capping structure. The recess abuts the second cavity. A vent is arranged within the capping structure. The vent extends from a top of the recess
(Continued)

to the upper surface of the capping structure. A lid is arranged within the vent and configured to seal the second cavity.

20 Claims, 24 Drawing Sheets

(58) Field of Classification Search
USPC ..... 257/415, 417, 528, 684; 438/52, 55, 125
See application file for complete search history.

(56) References Cited

U.S. PATENT DOCUMENTS

| | | |
|---|---|---|
| 2011/0215435 A1 | 9/2011 | Wakimoto et al. |
| 2012/0043627 A1 | 2/2012 | Lin et al. |
| 2012/0326248 A1 | 12/2012 | Daneman et al. |
| 2013/0001710 A1 | 1/2013 | Daneman et al. |
| 2013/0037891 A1 | 2/2013 | Huang et al. |
| 2013/0099355 A1 | 4/2013 | Liu et al. |
| 2013/0265701 A1 | 10/2013 | Takizawa |
| 2013/0277770 A1 | 10/2013 | Tsai et al. |
| 2014/0103461 A1 | 4/2014 | Chu et al. |
| 2014/0225206 A1 | 8/2014 | Lin et al. |
| 2014/0248730 A1 | 9/2014 | Huang et al. |

OTHER PUBLICATIONS

Non Final Office Action Dated Nov. 2, 2015 U.S. Appl. No. 14/698,985.
Non-Final Office Action dated Apr. 8, 2016 for U.S. Appl. No. 14/629,738.
U.S. Appl. No. 14/013,155, filed Aug. 29, 2013.
Non-Final Office Action dated Aug. 13, 2014 for U.S. Appl. No. 14/013,155.
Notice of Allowance dated Jan. 13, 2015 for U.S. Appl. No. 14/013,155.
U.S. Appl. No. 14/041,298, filed Sep. 30, 2013.
Non-Final Office Action dated Oct. 6, 2014 for U.S. Appl. No. 14/041,298.
Notice of Allowance dated Jan. 22, 2015 for U.S. Appl. No. 14/041,298.
U.S. Appl. No. 14/629,738, filed Feb. 24, 2015.
Notice of Allowance dated Jun. 29, 2016 for U.S. Appl. No. 14/698,985.
Notice of Allowance Dated Sep. 28, 2016 U.S. Appl. No. 14/629,738.

MICROELECTROMECHANICAL SYSTEMS (MEMS) DEVICES AT DIFFERENT PRESSURES

REFERENCE TO RELATED APPLICATION

The present application claims priority to U.S. provisional application filed on Nov. 7, 2014, which has an Application No. 62/076,579 and is entitled "Microelectromechanical Systems (MEMS) Devices At Different Pressures", the contents of which are incorporated herein in their entirety.

BACKGROUND

Recent developments in the semiconductor integrated circuit (IC) technology include microelectromechanical system (MEMS) devices. MEMS devices include mechanical and electrical features formed by one or more semiconductor manufacturing processes. Examples of MEMS devices include micro-sensors, which convert mechanical signals into electrical signals; micro-actuators, which convert electrical signals into mechanical signals; and motion sensors, which are commonly found in automobiles (e.g., in airbag deployment systems). For many applications, MEMS devices are electrically connected to application-specific integrated circuits (ASICs), and to external circuitry, to form complete MEMS systems. Commonly, the connections are formed by wire bonding, but other approaches are also possible.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
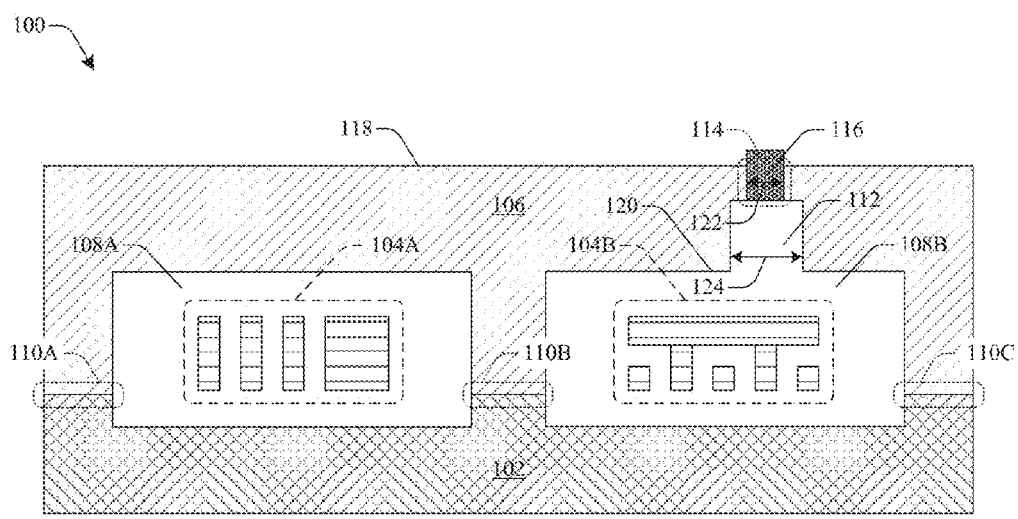
FIG. 1 illustrates a cross-sectional view of a semiconductor device that includes microelectromechanical system (MEMS) devices in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "First", "second", "third", etc. are not intended to be descriptive of the corresponding element. Therefore, "a first substratelectric layer" described in connection with a first figure may not necessarily corresponding to a "first substratelectric layer" described in connection with another figure.

Multiple MEMs device may be integrated onto a same integrated chip in recent generations of MEMs ICs. For example, motion sensors are used for motion-activated user interfaces in consumer electronics such as smartphones, tablets, gaming consoles, smart-TVs, and in automotive crash detection systems. To capture a complete range of movements within a three-dimensional space, motion sensors often utilize an accelerometer and a gyroscope in combination. The accelerometer detects linear movement. The gyroscope detects angular movement. To meet consumer demand for low cost, high quality, and small device footprint, the accelerometer and the gyroscope can be formed from microelectromechanical system (MEMS) devices, which are integrated together on a same substrate. Although they share the same substrate, and hence a same manufacturing process, the accelerometer and the gyroscope utilize different operating conditions. For example, the gyroscope is often packaged in a vacuum for optimal performance. In contrast, the accelerometer is often packaged at a predetermined pressure (e.g., 1 atmosphere) to produce a smooth frequency response.

Therefore, the present disclosure is directed to multiple MEMS devices that are integrated together on a single substrate. A device substrate comprising first and second micro-electro mechanical system (MEMS) devices is bonded to a capping structure. The capping structure comprises a first cavity arranged over the first MEMS device and a second cavity arranged over the second MEMS device. The first cavity is filled with a first gas at a first gas pressure. The second cavity is filled with a second gas at a second gas pressure, which is different from the first gas pressure. A recess is arranged within a lower surface of the capping structure. The recess abuts the second cavity. A vent is arranged within the capping structure. The vent extends from a top of the recess to the upper surface of the capping structure. A lid is arranged within the vent and configured to seal the second cavity. Other embodiments are also disclosed.

FIG. 1 illustrates a cross-sectional view of a semiconductor device 100 that includes first and second MEMS devices 104A, 104B arranged over a device substrate 102. A capping structure 106 is bonded to the device substrate 102. The capping structure 106 includes a first cavity 108A encasing the first MEMS device 104A, and a second cavity 108B encasing the second MEMS device 104B. The first or second MEMS device 104A, 104B may include, for example, a microphone, a gas pressure sensor, an accelerometer, a gyroscope, or any other device that interfaces with the external environment. In one embodiment, the first MEMS device 104A includes an accelerometer, and the second MEMS device 104B includes a gyroscope, which together form a motion sensor for a motion-activated user interface or for an automotive crash detection system.

Hermetic seal boundaries 110A-110C are formed between the device substrate 102 and the capping structure 106, such that the first and second cavities 108A, 108B can support pressures that are different from one another. It is appreciated that while the first and second cavities 108A, 108B share hermetic seal boundary 110C, other embodiments include first and second cavities 108A, 108B that do not share a common hermetic seal boundary. It is further appreciated other embodiments include a semiconductor device that includes three or more MEMS devices arranged within three or more cavities, where at least two of the cavities are independently maintained at gas pressures which are different from one another.

A recess 112 is arranged within the capping structure 106 in an upper surface 120 of the second cavity 108B. In some embodiments, the recess 112 may be located over the second MEMS device 104B. A vent 114 is formed through the capping structure 106, which vertically connects with the recess 112. The vent 114 and recess 112 collectively connect the second cavity 108B to an ambient environment that surrounds the semiconductor device 100. When unfilled, the vent 114 permits a second gas pressure within the second cavity 108B to be adjusted relative to a first gas pressure within the first cavity 108A. As a result, the second gas pressure is different from the first gas pressure. A lid 116 is formed within the vent 114 and/or over an upper surface 118 of the capping structure 106. The lid 116 forms a hermetic seal with sidewalls of the vent 114 and/or the upper surface 118 of the capping structure 106 to seal the second cavity 108B from the ambient environment.

In some embodiments, a first width 122 of the vent 114 is significantly less than a second width 124 of the recess 112. In such embodiments, the vent 114 is narrow enough that adhesive forces between surfaces of the lid 116 and surfaces of the capping structure 106, as well as surface tension of material that forms the lid 116, prevents the material from "falling through" the vent 114 and contaminating the second MEMS device 104B.

By independently controlling the pressures within the first and second cavities 108A, 108B, performance of the semiconductor device 100 can be improved. For example, performance of a motion sensor having a first MEMS device 104A including an accelerometer, and a second MEMS device 104B including a gyroscope can be increased by independently controlling the pressures within the first and second cavities 108A, 108B, which independently optimizes function of the first and second MEMS devices 104A, 104B (i.e., the accelerometer and the gyroscope).

Figure 2A:
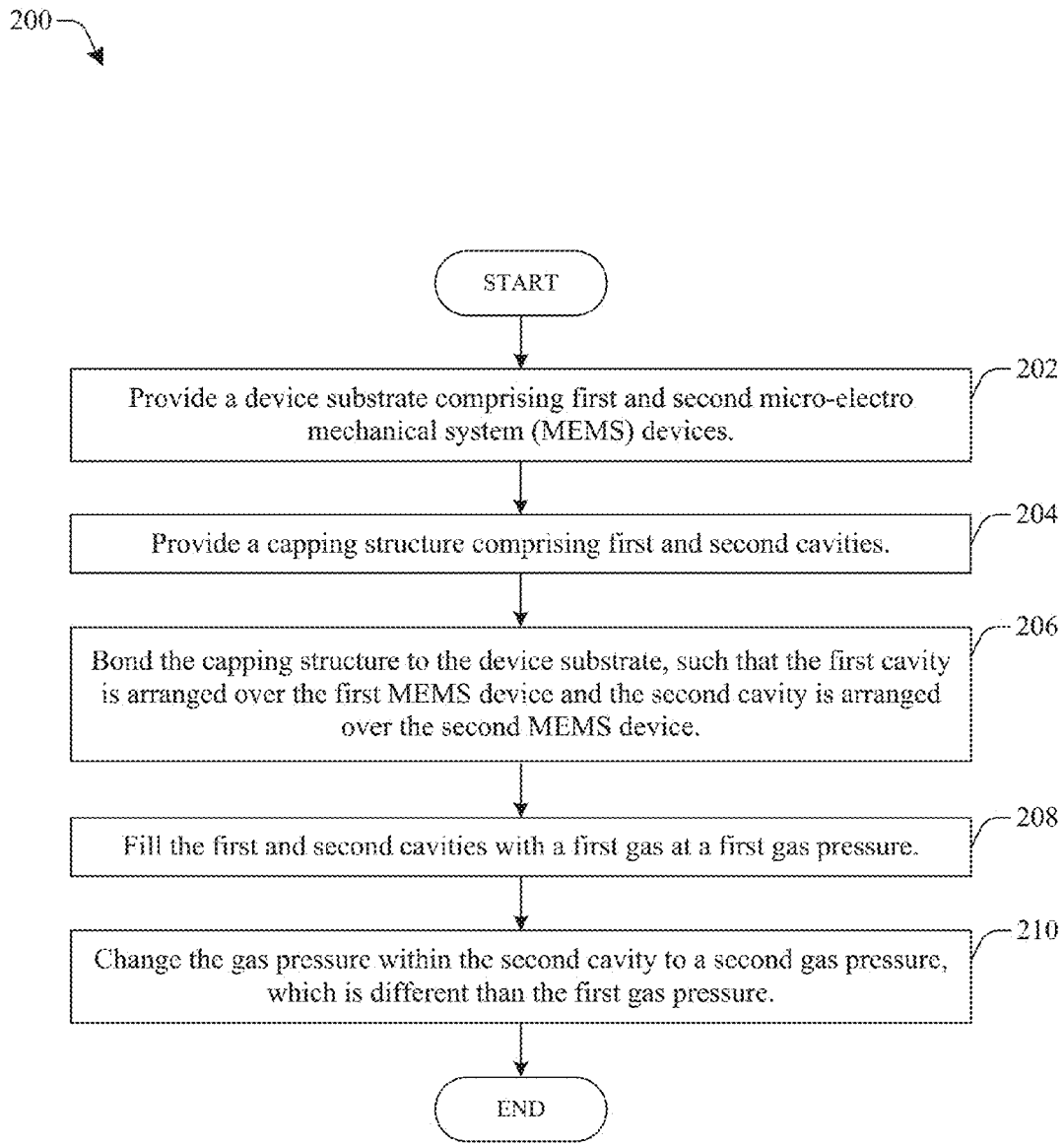
FIGS. 2A-2C illustrate flow charts of some embodiments of a method for manufacturing a semiconductor device in accordance with some embodiments.
Figure 2B:
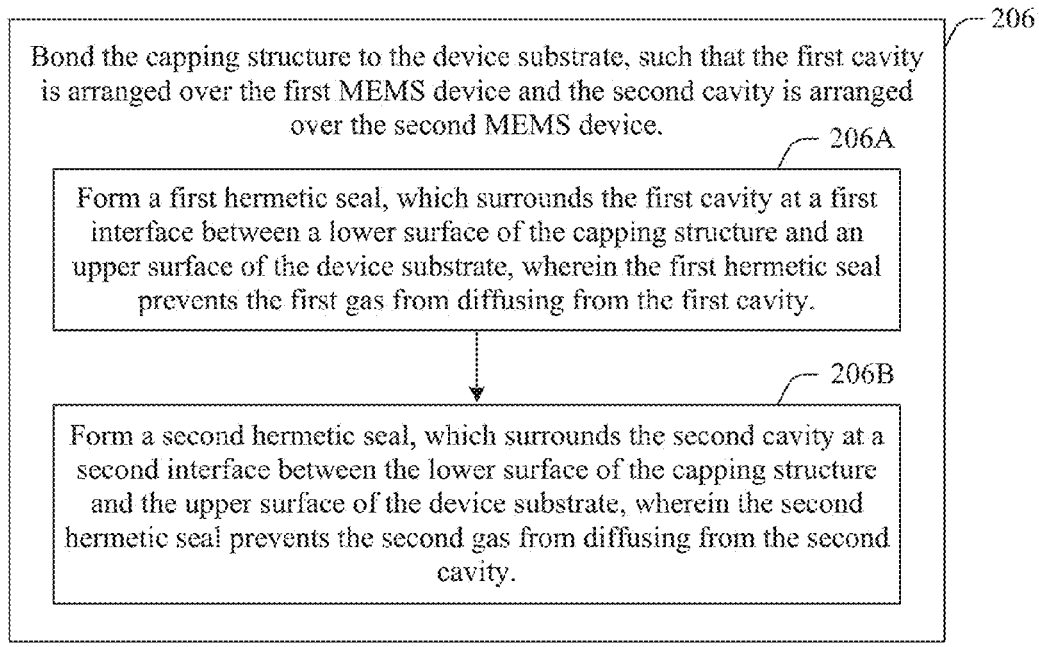
Figure 2C:
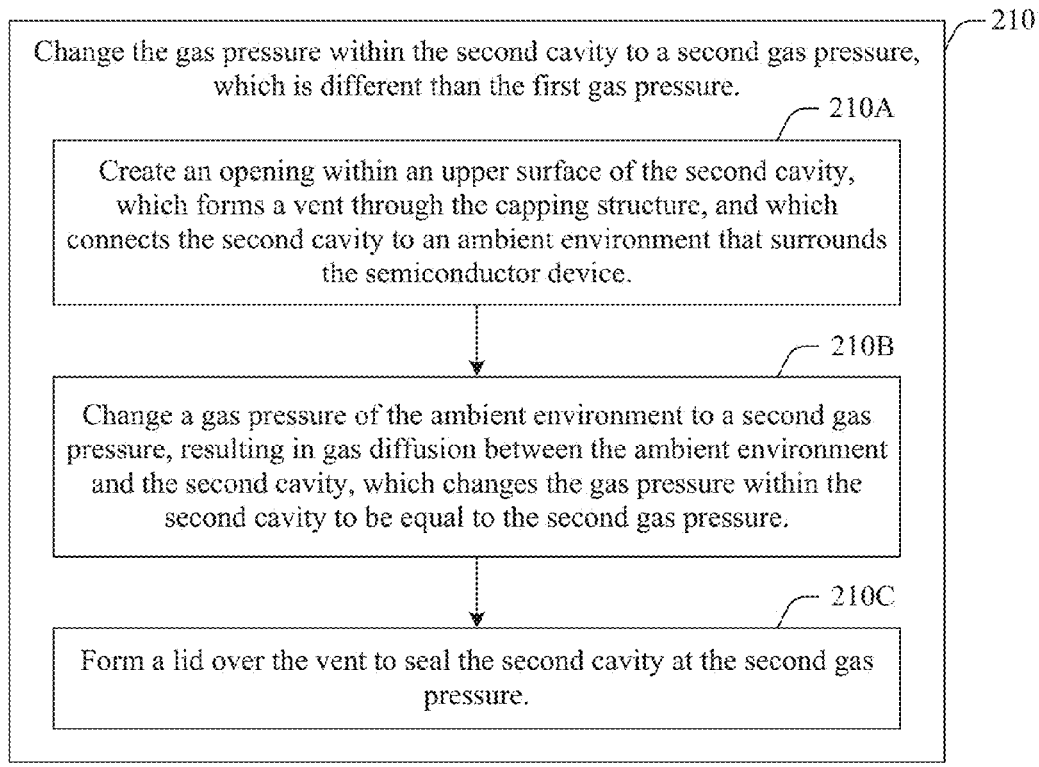

FIGS. 2A-2C illustrate flow charts of some embodiments of a method for manufacturing the semiconductor device with multiple MEMS cavities.

FIG. 2A illustrates a flow chart of some embodiments of a method 200 for manufacturing the semiconductor device of FIG. 1.

At 202, a device substrate is provided. The device substrate includes first and second MEMS devices.

At 204, a capping structure is provided. The capping structure includes first and second cavities formed within its lower surface.

At 206, the capping structure is bonded to the device substrate. Upon bonding, the first cavity is arranged over the first MEMS device and the second cavity is arranged over the second MEMS device.

At 208, the first and second cavities are filled with a first gas at a first gas pressure.

At 210, the pressure within the second cavity is changed to a second gas pressure, which is different from the first gas pressure.

FIG. 2B illustrates some further embodiments of bonding the capping structure to the device substrate (206 of method 200).

At 206A, a first hermetic seal is formed. The first hermetic seal surrounds the first cavity at a first interface between a lower surface of the capping structure and an upper surface of the device substrate. The first hermetic seal prevents the first gas from diffusing from the first cavity.

At 206B, a second hermetic seal is formed. The second hermetic seal surrounds the second cavity at a second interface between the lower surface of the capping structure and the upper surface of the device substrate. The second hermetic seal prevents the second gas from diffusing from the second cavity. Examples of first and second hermetic seals are given herein.

FIG. 2C illustrates some further embodiments of changing the gas pressure within the second cavity (210 of method 200).

At 210A, an opening is created within an upper surface of the second cavity. The opening forms a vent through the capping structure. The vent connects the second cavity to an ambient environment that surrounds the semiconductor device.

At 210B, a gas pressure of the ambient environment is changed to the second gas pressure. As a result, gas diffusion through the vent between the ambient environment and the second cavity changes the gas pressure within the second cavity to be equal to the second gas pressure.

At 210C, a lid is formed over the vent, which seals the second cavity at the second gas pressure.

Figure 3:
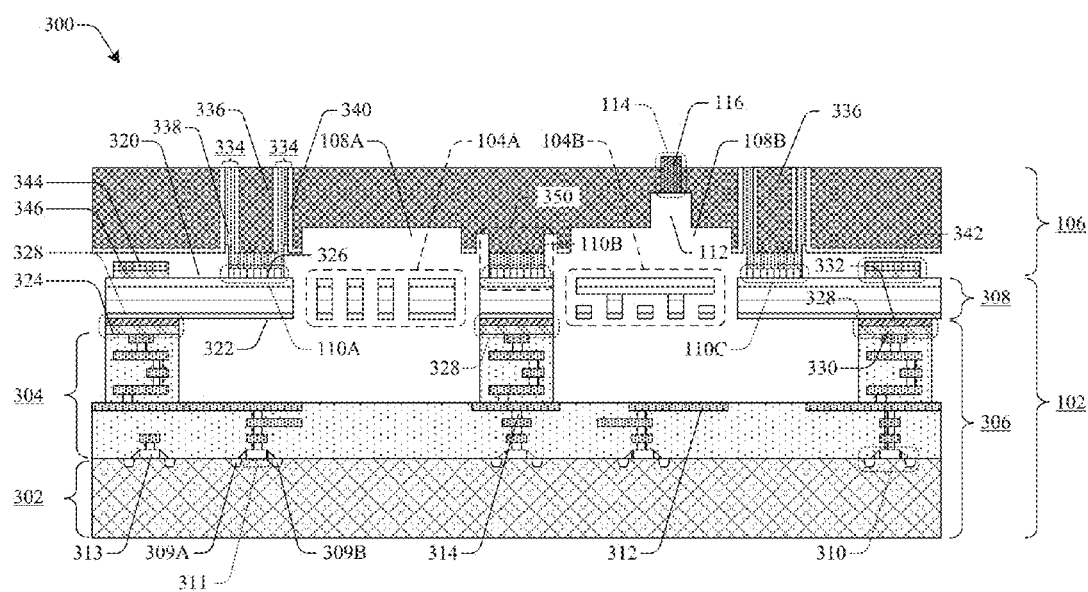
FIG. 3 illustrates a cross-sectional view of some embodiments of a semiconductor device in accordance with multiple MEMS cavities.

FIG. 3 illustrates some embodiments of a cross-sectional view of a semiconductor device 300 with multiple MEMS cavities. The semiconductor device 300 comprises a device substrate 102, which is bonded to a capping structure 106. The device substrate 102 includes a processed substrate 306 and a MEMS substrate 308, which are bonded together. The processed substrate 306 includes one or more active elements 310 (e.g., a transistor), comprising first and second source/drain regions 309A, 309B, which are separated by a channel region 311 arranged below a gate 313. A series of metallization planes 312 and via interconnects 314 connect to the one or more active elements 310. In some embodiments, the processed substrate 306 includes a semiconductor substrate 302. The metallization planes 312 and the via interconnects 314 are arranged within an inter-metal dielectric (IMD) material 304 formed over an upper surface of the semiconductor substrate 302.

The MEMS substrate 308 includes a semiconductor material or a non-semiconductor material. In some embodiments, the MEMS substrate 308 includes the same material that is used for the semiconductor substrate 302. In some embodiments, the MEMS substrate 308 includes a semiconducting material different from that of the semiconductor substrate 302. The MEMS substrate 308 has an upper surface 320 that is bonded to the capping structure 106, and an opposite, lower surface 322 that is bonded to an upper surface 324 of the IMD material 304. The MEMS substrate 308 includes first and second MEMS devices 104A, 104B, which are arranged within first and second cavities 108A, 108B. The first and second cavities 108A, 108B are formed between the device substrate 102 and the capping structure 106. In some embodiments, the first and second cavities 108A, 108B extend into the device substrate 102. For instance, as shown on FIG. 3, the first and second cavities 108A, 108B extend into the IMD material 304 to provide clearance for movable parts of the first or second MEMS device 104A, 104B. In other embodiments, the first and second cavities 108A, 108B extend into the semiconductor substrate 302.

First through third hermetic seal boundaries 110A-110C are formed between the device substrate 102 and the capping structure 106, such that the first and second cavities 108A, 108B can support gas pressures that are different from one another. For the embodiments of the semiconductor device 300 the first through third hermetic seal boundaries 110A-110C comprise one or more bonding materials 326.

The capping structure 106 may be utilized in wafer level chip scale package (WLCSP) technology (e.g., which packages an integrated chip at a wafer level, rather than after singulation) to lower fabrication costs and to achieve a smaller substrate size. The capping structure 106 of semiconductor device 300 includes a re-distribution layer (RDL) of conductive material (e.g., low resistance silicon) to provide for electrical routing (e.g., lateral routing) along the capping structure to an input/output (I/O) connection point of a semiconductor device 300. Within the capping structure 106, an isolation trench 334 encloses a low resistance conductive pillar 336 (e.g., Si-pillar). The isolation trench 334 electrically isolates the low resistance conductive pillar 336 from a remainder of the capping structure 106. The first through third hermetic seal boundaries 110A-110C are also conductive. As a result, the low resistance pillar 336 provides an electrical conduction path from a top surface of the capping structure 106, through the hermetic seal boundaries 110A, 110C to the MEMS substrate 308. The second hermetic seal 110B is not connected to a pillar 336. The second hermetic seal 110B is connected to a guard ring 350 of the capping structure 106, which seals the first and second cavities 108A, 108B, and provides an electrical path between the capping structure 106 and the MEMS substrate 308.

By providing a conductive path from the MEM substrate 308 to the top surface of the capping structure 106, the low resistance pillar 336 enable semiconductor device 300 to be manufactured by way of the WLCSP technology. This is because the low resistance pillar 336 allows for an electrical connection between the MEM substrate 308 and an external circuits without additional packaging operations. For example, the low resistance pillar 336 allows for an external connection (e.g., a wirebonding or flip chip solder ball) to be formed on the upper surface of the capping structure 106 (e.g., on top of the pillars 336) prior to singulation of the device substrate 102.

The isolation trench 334 of the semiconductor device 300 is filled with silicon 338 (e.g., poly-Si) and dielectric material 340 (e.g., SiO2). The silicon 338 provides a conductive path in parallel with the pillar 336. The dielectric material 340 electrically isolates the pillar 336 within the capping structure 106. A solder bump (not shown) may be arranged onto a top of the pillar 336 to provide a connection point between the pillar 336 and an external circuit (e.g., a system level printed circuit board (PCB)), to which the capping structure 106 may be mounted after chip dicing.

The processed substrate 306 and the MEMS substrate 308 may be bonded by eutectic bonds 328, which comprise a bottom bond pad 330 (e.g., Al, Cu, Ti, Ta, Au, Ni, Sn) arranged on the upper surface 324 of the IMD material 304, and a top bond pad 332 (e.g., Ge, Si) arranged below the lower surface 322 of the MEMS substrate. The eutectic bonds 328 connect the MEMS substrate 308 to the active elements 310 of the processed substrate 306 through the metallization planes 312 and the via interconnects 314. MEMS contact pads 342 are arranged on the top of the MEMS substrate 308 above the eutectic bonds 328. The MEMs contact pads 342 provide for an area electrical connection between the processed substrate 306 and the MEMs substrate 308. The MEMS contact pads 342 comprise a top pad layer 344 (e.g., TiN) disposed over a bottom pad 346 (e.g., AlCu). The MEMS contact pads 342 provide an electrical connection between the processed substrate 306 and the MEMS substrate 308. In some embodiments, the processed substrate 306 and the MEMS substrate 308 are connected through a via. In some embodiments, the MEMS substrate 308 is not connected to active elements 310 of the processed substrate 306. In other embodiments, the MEMS substrate 308 is not connected to the processed substrate 306.

A vent 114 vertically extends through the capping structure 106 to connect the second cavity 108B to an ambient environment that surrounds the semiconductor device 300. The vent 114 permits a second gas pressure within the second cavity 108B to be independently adjusted relative to a first gas pressure within the first cavity 108A. A lid 116 is arranged within the vent 114 and/or over an upper surface 118 of the capping structure 106 to seal the second cavity 108B. The lid 116 forms a hermetic seal with sidewalls of the vent 114 and/or the upper surface 118 of the capping structure 106.

Figure 4:
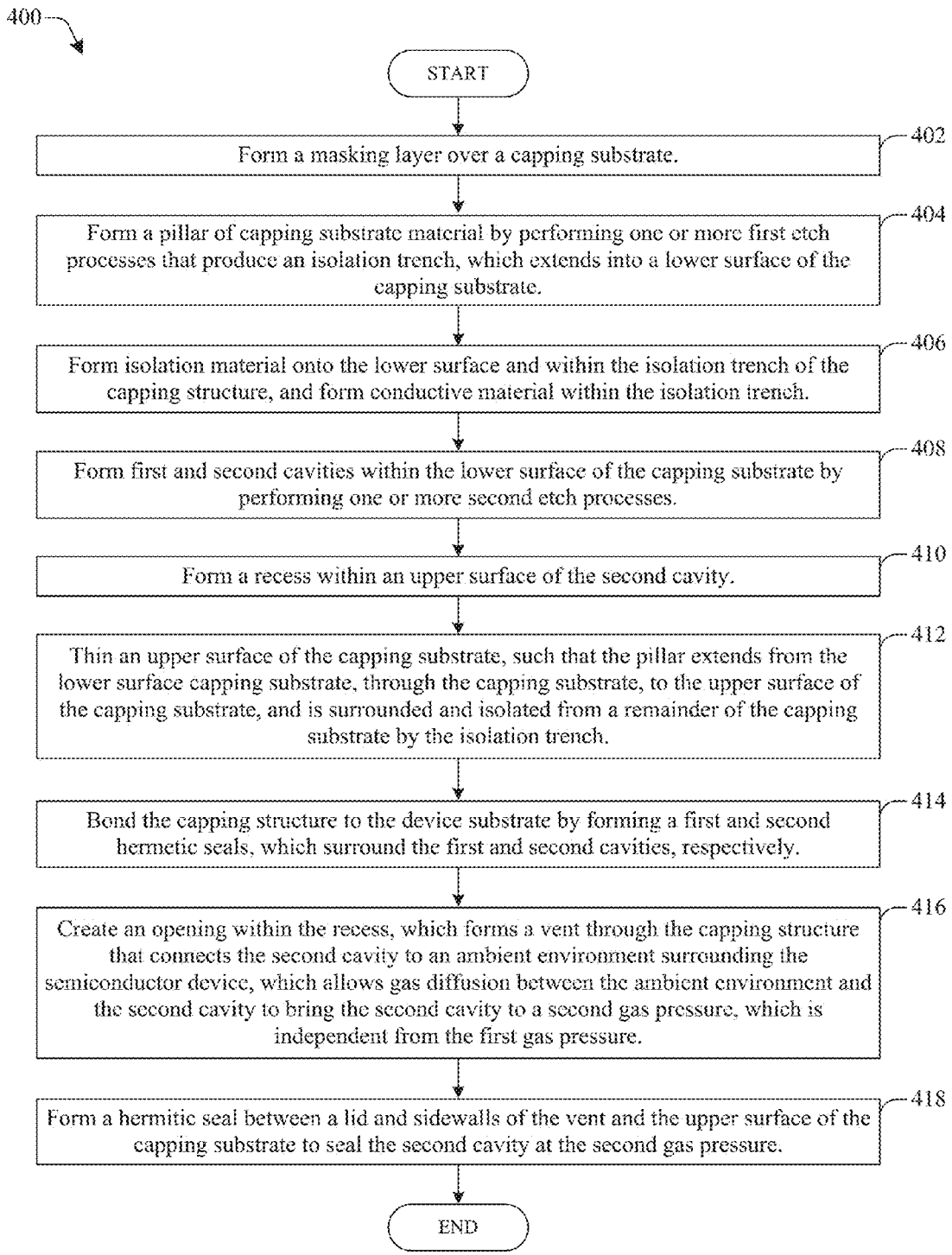
FIG. 4 illustrates a flow chart of some embodiments of a method for manufacturing a semiconductor device in accordance with multiple MEMS cavities.

FIG. 4 illustrates a flow chart of some embodiments of a method 400 for manufacturing a semiconductor device with multiple MEMS cavities by using a wafer level chip scale package (WLCSP).

At 402, a masking layer is selectively formed over a capping substrate. The capping substrate is conductive (e.g., low resistance Si).

At 404, a pillar of capping substrate material is formed by performing one or more first etch processes to a lower surface of the capping substrate. The one or more first etch processes produce an isolation trench, which extends into the lower surface of the capping substrate and surrounds the pillar.

At 406, isolation material is formed onto the lower surface and within the isolation trench of the capping structure according to the masking layer, and conductive material is formed within the isolation trench. The isolation material may sandwich the conductive material within the isolation trench, so as to isolate the pillars of capping substrate material from a remainder of the capping substrate and form conductive paths that run in parallel to the pillar.

At 408, first and second cavities are formed within the lower surface of the capping substrate by performing one or more second etch processes to the lower surface. In some embodiments, the one or more second etch processes are performed simultaneously with the one or more first etch processes.

At 410, a recess is formed within an upper surface of the second cavity (i.e., the lower surface of the capping substrate).

At 412, an upper surface of the capping substrate is thinned (e.g., by a grinding the upper surface), which exposes the isolation trench. As a result, the pillar extends from the lower surface capping substrate, through the capping substrate, to the upper surface of the capping substrate. The pillar is surrounded and isolated from a remainder of the capping substrate by the isolation trench.

At 414, the capping substrate is bonded to a device substrate by forming a first and second hermetic seals between the capping structure and the device substrate. The device substrate comprises a processed semiconductor substrate (e.g., a Si wafer with active elements 310) bonded to a MEMS substrate, which contains first and second MEMS devices (e.g., an accelerometer and a gyroscope). The first and second hermetic seals surround the first and second cavities. Examples of hermetic seals include, but are not limited to eutectic bonds, fusion bonds, thermal compressive bonds, and the like.

At 416, an opening is created within the recess. The opening and recess collectively form a vent through the capping structure. The vent connects the second cavity to an ambient environment that surrounds the semiconductor device. As a result, gas diffuses through the vent between the ambient environment and the second cavity to bring the second cavity to a second gas pressure.

At 418, a hermitic seal is formed between a lid and sidewalls of the vent and the upper surface of the capping substrate to seal the second cavity at the second gas pressure.

FIGS. 5A-5M illustrate some embodiments of a series of cross-sectional views that collectively depict formation of a semiconductor device with multiple MEMS cavities. Although FIGS. 5A-5M are described in relation to the method 400, it will be appreciated that the structures disclosed in FIGS. 5A-5M are not limited to the method 400, but instead may stand alone as structures independent of the method 400. Similarly, although the method 400 is described in relation to FIGS. 5A-5M, it will be appreciated that the method 400 is not limited to the structures disclosed in FIGS. 5A-5M, but instead may stand alone independent of the structures disclosed in FIGS. 5A-5M.

Figure 5A:
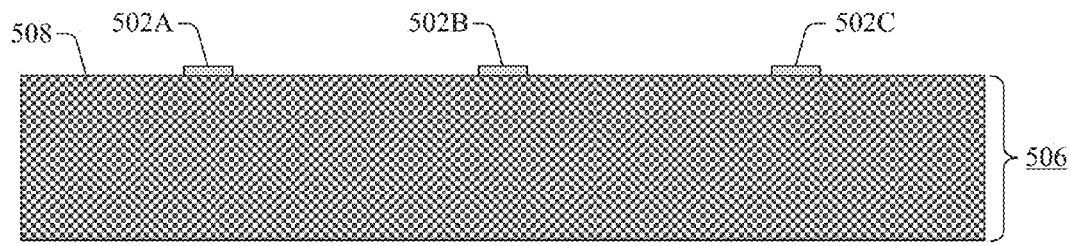
FIGS. 5A-5M illustrate some embodiments of a series of cross-sectional views that collectively depict formation of a semiconductor device in accordance with multiple MEMS cavities.

FIG. 5A illustrates a cross sectional view of a capping substrate 506 corresponding to act 402. A silicon nitride (SiN) masking layer has been deposited and patterned to form first through third deposited SiN regions 502A-502C.

In some embodiments, deposition of the SiN layer involves chemical vapor deposition (CVD), sputtering, or other appropriate deposition process. Patterning of the first through third deposited SiN regions 502A-502C involves photolithography and etching.

Figure 5B:
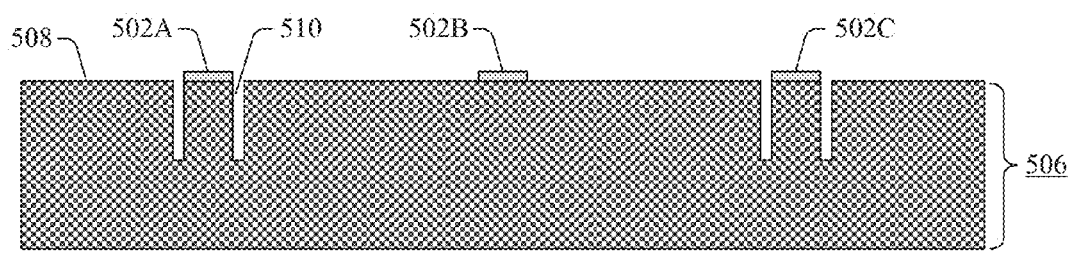

In FIG. 5B, which corresponds to act 404, isolation trenches 510 have been formed through photolithography and etching of the lower surface 508 of the capping substrate 506. In some embodiments, the etch simultaneously produces first and second cavities 108A, 108B within the lower surface 508 of the capping substrate 506. In some embodiments, a separate, second etch produces the first and second cavities 108A, 108B (as illustrated in FIG. 5G), in order to prevent oxidation of the sidewalls, during the oxidation process of FIG. 5C.

Figure 5C:
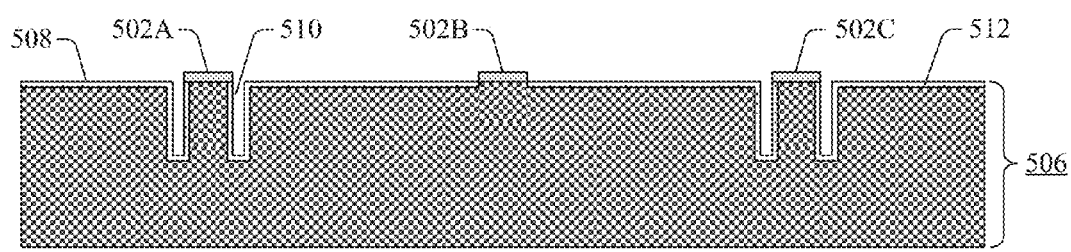

In FIG. 5C, which corresponds to act 406, an oxidation layer 512 (e.g., $SiO_2$) has been formed on the lower surface 508 of the capping substrate 506 and along sidewalls and bottom surfaces of the isolation trenches 510. In some embodiments, the oxidation layer 512 is formed by thermal oxidation of the capping substrate 506 in a furnace environment. The oxidation layer 512 does not form on areas of the lower surface 508 of the capping substrate 506 that are covered by the first through third deposited SiN regions 502A-502C.

Figure 5D:
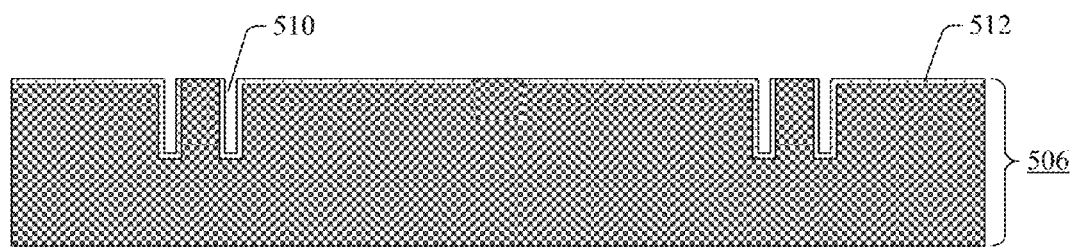

In FIG. 5D, which corresponds to act 406, the first through third deposited SiN regions 502A-502C have been removed. In various embodiments, removal of the first through third deposited SiN regions 502A-502C is accomplished by a reactive ion etching (RIE) process, or a selective etch.

Figure 5E:
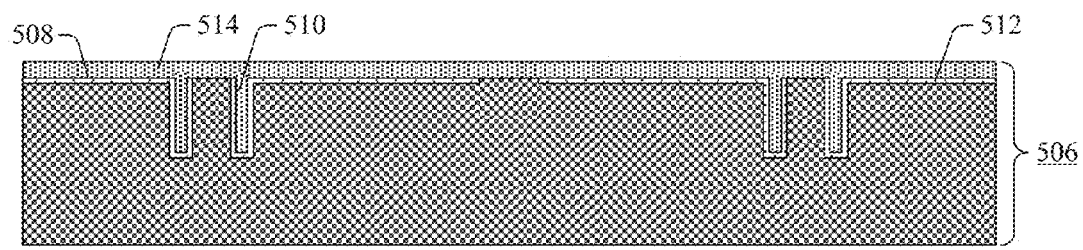

In FIG. 5E, which corresponds to act 406, the isolation trenches 510 have been filled with polysilicon 514, which extends over the lower surface 508 of the capping substrate 506. In various embodiments, the polysilicon 514 is formed by CVD (e.g., low-pressure CVD (LPCVD) or plasma-enhanced CVD (PECVD)), physical vapor deposition (PVD), atomic layer deposition (ALD), molecular beam epitaxy (MBE), electron beam (e-beam) epitaxy, or other appropriate process. The polysilicon 514 is used to make an electrical contact with a pillar (336), which is subsequently formed below it within the capping substrate 506.

Figure 5F:
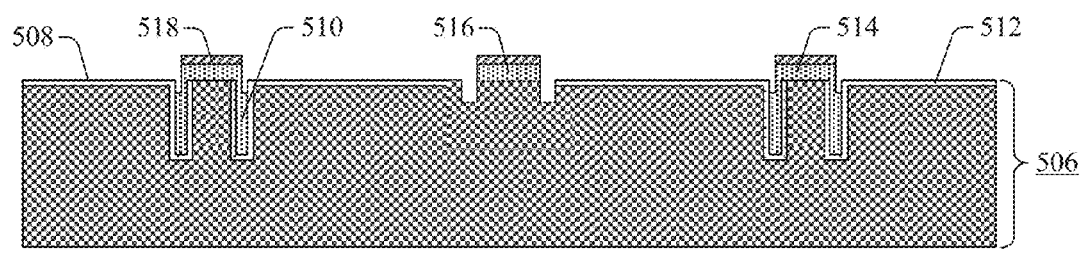
Figure 5G:
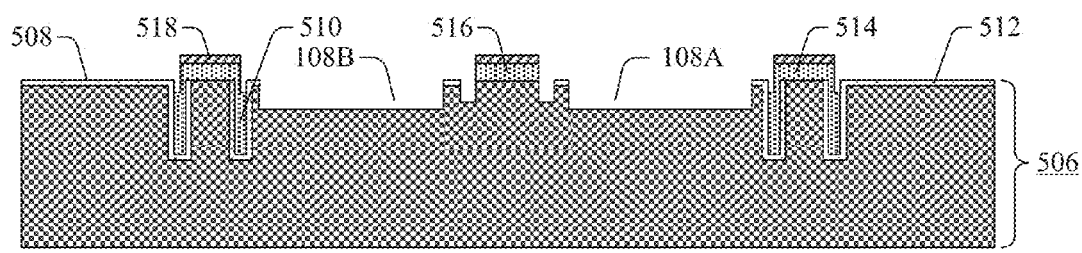

In some embodiments, shown in FIG. 5F, a metal layer 518 (e.g., Ge) has been disposed over the polysilicon 514 (e.g., through sputtering). The metal and polysilicon 514 have then been patterned and etched through photolithography and etching to form polysilicon stand-offs 516, which are physically and electrically connected to the polysilicon in the isolation trenches 510. The polysilicon stand-offs 516 serve as electrical conduction paths in parallel with the subsequently formed pillar (336). The remaining portions of the metal layer 518 are arranged on the polysilicon stand-offs 516 and are configured to form part of a eutectic bond between the capping substrate 506 and a device substrate.

In FIG. 5G, which corresponds to act 408, first and second cavities 108A, 108B have been etched within the lower surface 508 of the capping substrate 506. In various embodiments, the etch that produces the first and second cavities 108A, 108B can be performed simultaneously with the etch that produced the isolation trenches 510 (in FIG. 5B), or the etch that produced the polysilicon stand-offs 516 (in FIG. 5F).

Figure 5H:
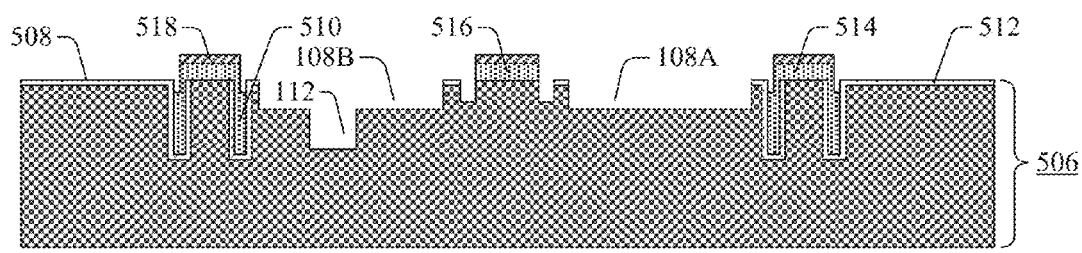

In FIG. 5H, which corresponds to act 410, a recess 112 has been formed within the lower surface 508 of the capping substrate 506 (i.e., upper surface of the second cavity) through photolithography and etching of the lower surface 508 of the capping substrate 506 (act 408 of method 400).

Figure 5I:
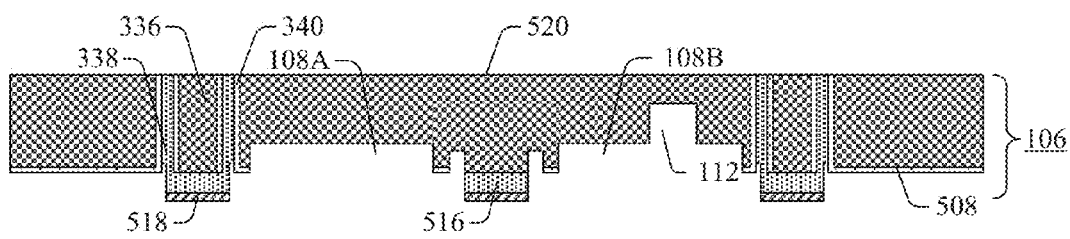

In FIG. 5I, which corresponds to act 412, the capping substrate 506 has been flipped over and thinned though a grinding process, such as a chemical mechanical polish (CMP), to produce the capping structure 106.

Figure 5J:
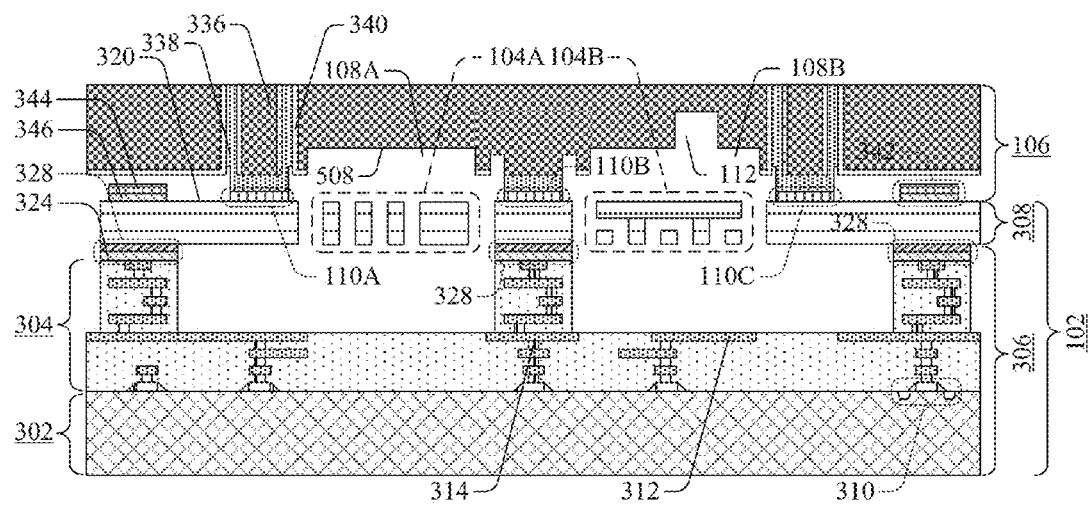

In FIG. 5J, which corresponds to act 414, the capping structure 106 has been bonded to a device substrate 102. The device substrate 102 includes a processed substrate 306, which is bonded to a MEMS substrate 308. The bonding forms a first hermetic seal comprising the first and second hermetic seal boundaries 110A, 110B. The first hermetic seal surrounds the first cavity 108A at an interface between the lower surface 508 of the capping structure 106 and the upper surface 320 of the device substrate 102 (of the MEMS substrate 308). Simultaneously, bonding forms a second hermetic seal comprising the second and third hermetic seal boundaries 110B, 110C. The second hermitic seal surrounds the second cavity 108B at an interface between the lower surface 508 of the capping structure 106 and the upper surface 320 of the device substrate 102. Examples of heretic seals include thermal compressive bonding, fusion bonding, and eutectic bonding with one or more bonding materials. Various examples of bonding material 326 and bonding schemes between the capping structure 106 and the device substrate 102 are illustrated in FIGS. 11A-11F.

In some embodiments, the processed substrate 306 and capping structure have a same doping type. In various embodiments, the processed substrate 306 is an elementary semiconductor, a compound semiconductor, or an alloy semiconductor. Examples of elementary semiconductors include, but are not limited to, one or more of silicon and germanium. Examples of compound semiconductors include, but are not limited to, one or more of silicon carbide, gallium arsenide, gallium phosphide, indium phosphide, indium arsenide, and indium antimonide. Examples of alloy semiconductors include, but are not limited to, one or more of SiGe, GaAsP, AlInAs, AlGaAs, GaInAs, GaInP, and GaInAsP. In some embodiments, the processed substrate 306 includes a non-semiconductor material. Examples of non-semiconductor materials include, but are not limited to, one or more of glass, fused quartz, and calcium fluoride.

Figure 5K:
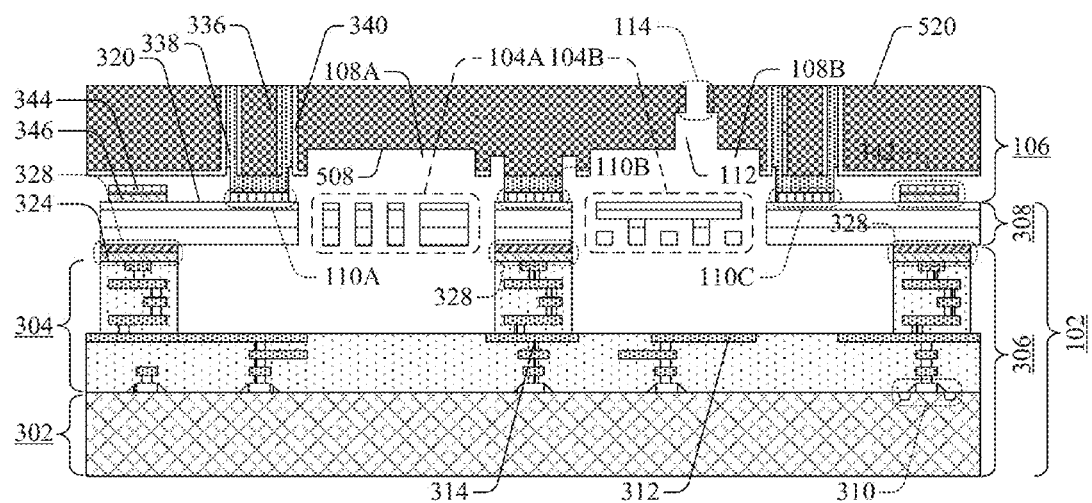

In FIG. 5K, which corresponds to act 416, a vent 114 has been formed the upper surface of the second cavity 108B. In some embodiments, the vent 114 is formed through photolithography and etching of the upper surface 520 of the capping substrate 506. The vent 114 connects the second cavity 108B to an ambient environment surrounding the capping structure 106 and the device substrate 102. In some embodiments, the vent 114 is narrower than the recess 112.

Upon formation of the vent 114, a gas pressure of the ambient environment is changed to the second gas pressure. In some embodiments, the capping structure 106 and device substrate 102 may be bonded in a processing chamber, and the gas pressure of the ambient environment is changed in situ. For example, the gas pressure within the processing chamber is maintained at the first gas pressure throughout the processing steps illustrated in FIGS. 5A-5K. Then, after formation of the vent 114 in FIG. 5K, the gas pressure within the processing chamber is adjusted to the second gas pressure. Gas diffusion is allowed to occur through the vent 114 between the ambient environment and the second cavity 108B. Once the gas diffusion reaches a steady-state condition, the gas pressure within the second cavity 108B is equal to the second gas pressure.

Figure 5L:
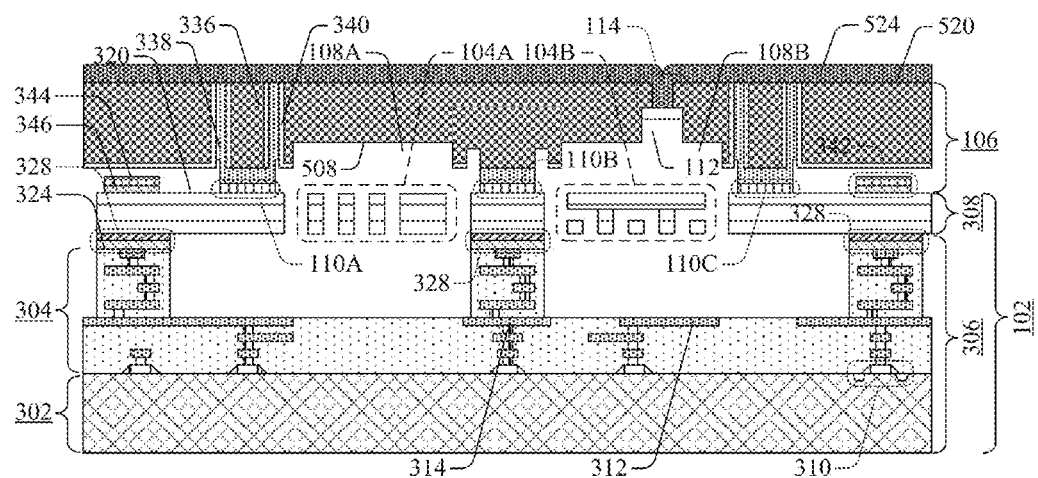

In FIG. 5L, which corresponds to act 418, a conformal layer of lid material 524 has been disposed over the upper surface 520 of the capping structure 106 (act 416 of method 400). In various embodiments, the lid material 524 comprises SiN, SiON, oxide, photoresist (PR), polyimide, amorphous carbon (a-C), polysilicon, amorphous silicon (a-Si), metal (e.g. AlCu etc.) epoxy, or other suitable material. The suitability of the lid material 524 is determined by several factors, including, but not limited to, the material used to form the capping structure 106 and the second gas pressure within the second cavity 108B. Other considerations for the suitability of the lid material 524 include a thermal budget of forming the semiconductor device 300, which may result in softening of the lid material 524. For a second gas pressure of less than about 3 torr, the lid material 524 may comprise a metal film (e.g., formed via sputtering). For a second gas pressure in a range of about 3 torr to about 100 torr the lid material 524 may comprise oxide, SiN, SiON, or a-C (e.g., formed via CVD). For a third gas pressure in a range of about 100 torr to about 500 torr the lid material 524 may comprise polysilicon. For a fourth gas pressure in a range of about 500 torr to about 1,000 torr the lid material 524 may comprise PR, polyimide or epoxy (e.g., formed via a UV cure technique), or a CVD oxide (e.g., formed under atmospheric pressure (APCVD)).

Figure 5M:
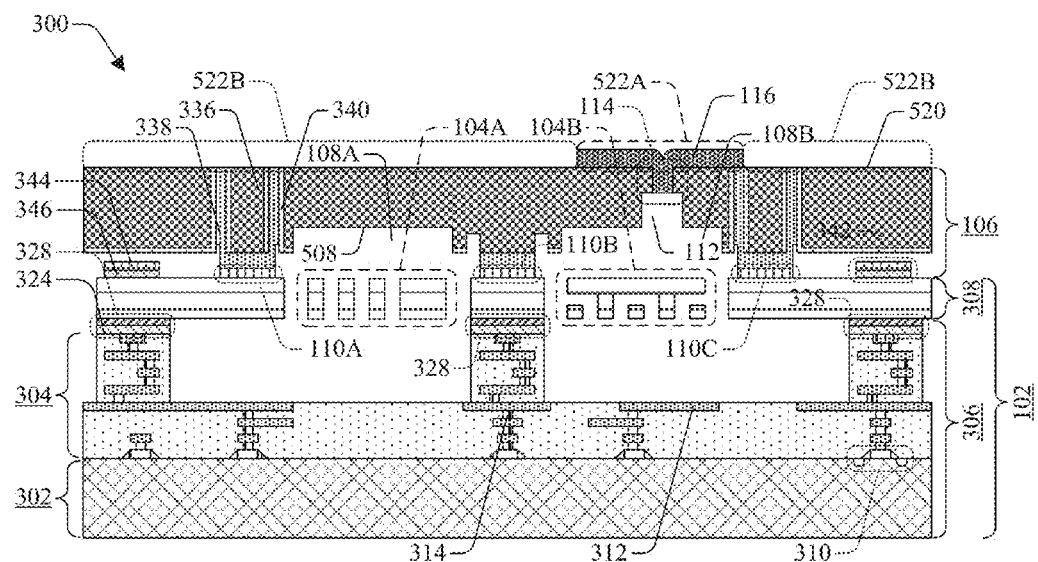

In FIG. 5M, which corresponds to act 418, the lid material 524 has been patterned through photolithography and etching to form a lid 116, which is arranged over a first portion 522A of the upper surface 520 of the capping structure 106 in a vicinity of the vent 114. The removed lid material 524 exposes a second portion 522B of the upper surface 520 of the capping structure 106. The lid 116 forms a hermitic seal between the lid and sidewalls of the vent 114 and the upper surface 520 of the capping structure 106 to seal the second cavity 108B at the second gas pressure. For some embodiments of semiconductor device 300, the vent 114 is narrower than the recess 112. As a result, the vent 114 is narrow enough that adhesive forces between surfaces of the lid 116 and surfaces of the capping structure 106, as well as surface tension of material that forms the lid 116, prevents the material from "falling through" the vent 114 and contaminating the second MEMS device 104B.

Figure 6A:
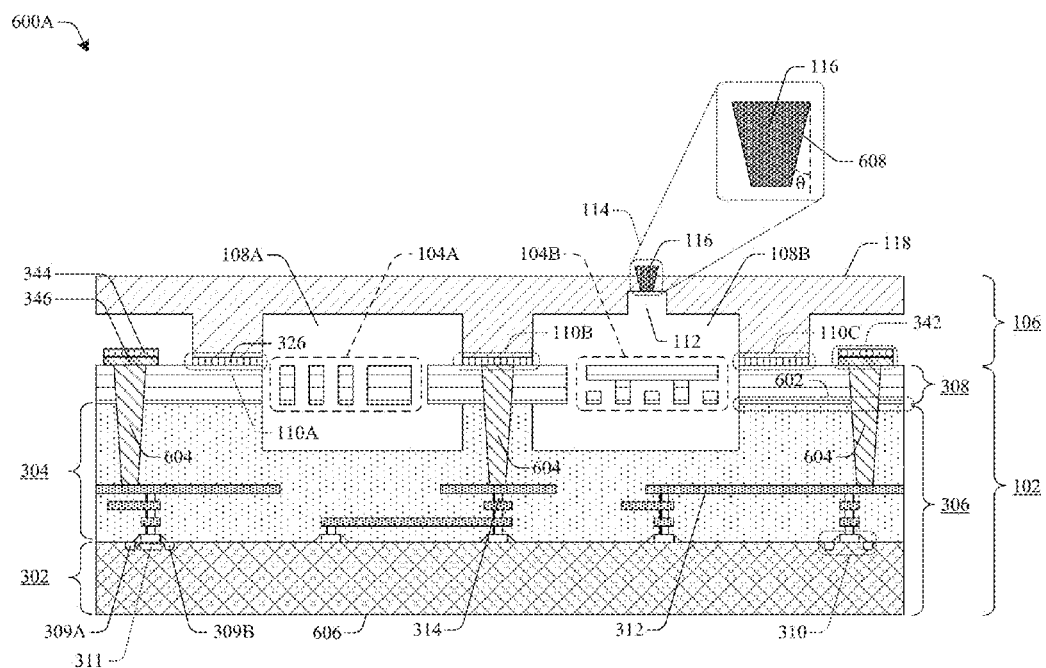
FIGS. 6A-6B illustrates a cross-sectional view of semiconductor devices with multiple MEMS cavities.
Figure 6B:
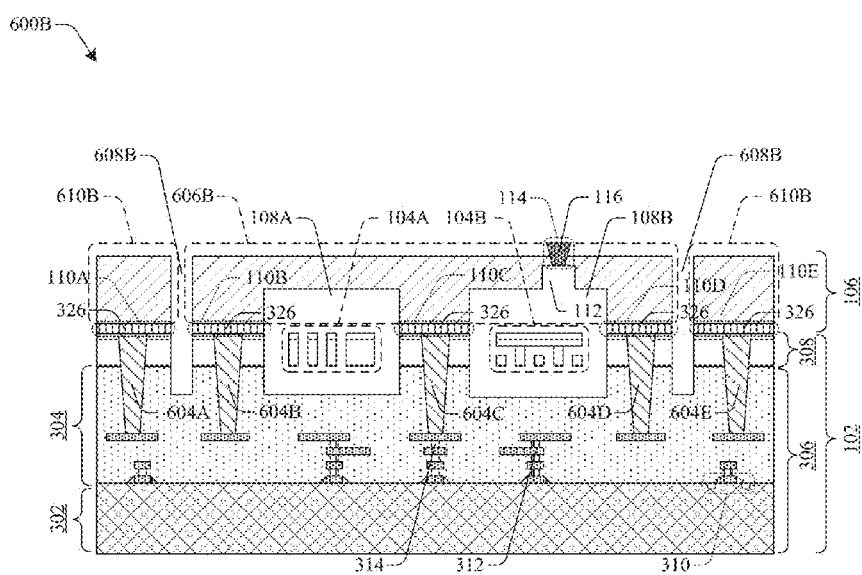

FIGS. 6A-6B illustrate some embodiments of semiconductor devices formed using some non-WLCSP process(es). While the WLCSP process integrates the whole packacking process by using the pillar 336, non-WLCSP processes utilize a cap wafer. The cap wafer is patterned and etched through one or more lithography processes before bonding. The cap wafer is then bonded to a device wafer formed from a singular die. Some examples of non-WLCSP process(es) include a partial die saw process, an only grinding process (OGP), and a grind to open process (GTO). In the partial die saw process, a blade produces a reference cut along a scribe line of a wafer, the wafer is then thinned by a grind process, then the wafer is diced along the reference cut to exposure the pad area. The OGP or GTO processes can be alternatively used to singularize the wafer. The OGP or GTO processes use grinding only.

FIG. 6A illustrates some embodiments of a cross-sectional view of a semiconductor device 600A. The semiconductor device 600A comprises a device substrate 102, which is bonded to a capping structure 106. The processed substrate 306 and the MEMS substrate 308 are bonded by fusion bonds formed at an interface 602 between the two. The fusion bonds connect the MEMS substrate 308 to the active elements 310 of the processed substrate 306 through the metallization planes 312 and the via interconnects 314, and through silicon vias (TSVs) 604. In at least one embodiment, the TSVs 604 include tungsten (W). First through third hermetic seal boundaries 110A-110C are formed from one or more bonding materials 326. At least one of the TSVs 604 is configured for an electrical connection to external circuitry. At least one of the TSVs 604 is configured for an internal electrical connection (e.g., between the MEMs substrate 308 and the active elements 310 of the device substrate 102).

A vent 114 is arranged within the capping structure 106. Sidewalls 608 of the vent 114 form a taper angle (θ) such that the vent is wider at its top (i.e., a first interface with the upper surface 520 of the capping structure 106) than at its bottom (i.e., a second interface with a top of the recess 112).

A lid 116 is formed within the vent 114 and/or over an upper surface 118 of the capping structure 106. The lid 116 forms a hermitic seal with sidewalls of the vent 114 and/or the upper surface 118 of the capping structure 106 to seal the second cavity 108B from the ambient environment. The narrow bottom of the vent 114 helps prevent contamination of the second MEMS device 104B by lid material by decreasing an amount of a bottom surface 610 of the lid 116 that is exposed to the second cavity 108B. The bottom surface 610 of the lid 116 is suspended by adhesive forces between surfaces of the lid 116 and surfaces of the capping structure 106, as well as surface tension of material that forms the lid 116.

MEMS contact pads 342 are arranged on the top of the MEMS substrate 308 above the interface 602. The MEMS contact pads 342 comprise a top pad layer 344 (e.g., TiN) disposed over a bottom pad (e.g., AlCu). The MEMS contact pads 342 improve the electrical interface between the TSVs 604 and the MEMS substrate 308.

First and second cavities 108A, 108B are formed within the capping structure 106. The first and second cavities 108A, 108B cover first and second MEMS devices 104A, 104B, respectively. The first and second cavities 108A, 108B also extend into the device substrate 102 (i.e., the IMD material 304) to permit movement of one or more moveable features of the first and second MEMS devices 104A, 104B. The first and second cavities 108A, 108B are maintained at first and second gas pressures, respectively, which are different from one another.

FIG. 6B illustrates some embodiments of a cross-sectional view of a semiconductor device 600B, which includes external connection portions 610B of the capping structure 106 (e.g., formed through an etch of the capping structure 106). Trenches 608B separate the external connection portions 610B from the cap portion 606B. As a result, first and fifth TSVs 604A, 604E form connections between the device substrate 102 and the external circuitry, through the external connection portions 610B. Second through fourth TSVs 604B-604D form connections between the processed substrate 306 and the MEMS substrate 308.

In some embodiments, the external connection portions 610B are configured with a width smaller than a width of the first through fifth TSVs 604A-604E. In some embodiments, the external connection portions 610B have a width of 50 μm and smaller. Compared to other approaches where TSVs are formed with a width of at least 90 μm, such embodiments permit a greater number of input/outputs (I/Os) to be formed and/or permit increased flexibility in I/O arrangement within a preset substrate area.

Figure 7:
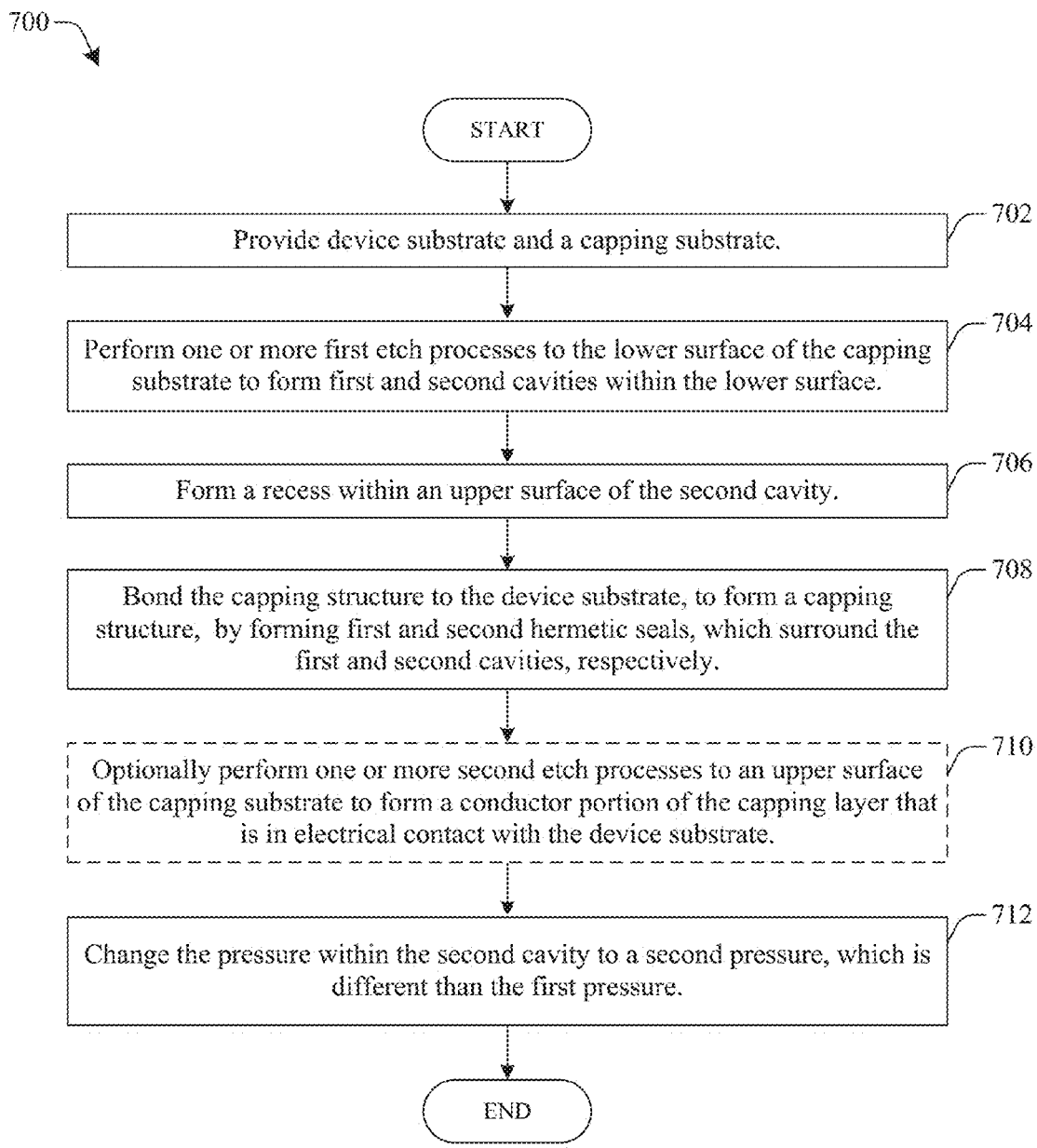
FIG. 7 illustrates a flow chart of some embodiments a semiconductor device with multiple MEMS cavities.

FIG. 7 illustrates a flow chart of some embodiments of a method 700 for manufacturing the semiconductor device of FIG. 6 using a non-wafer level chip scale package (WLCSP).

At 702, a device substrate and a capping substrate are provided. In some embodiments, the device substrate comprises a semiconductor substrate that is bonded to a MEMS substrate containing first and second MEMS devices. In some embodiments, the semiconductor substrate is electrically connected to the MEMS substrate by one or more TSVs.

At 704, one or more first etch processes are performed to a lower surface of the capping substrate to form first and second cavities within the lower surface of the capping substrate.

At 706, a recess is formed within an upper surface of the second cavity (i.e., and the lower surface of the capping substrate).

At 708, the capping substrate is bonded to the device substrate, to form a capping structure, by forming first and second hermetic seals. The first and second hermetic seals surround the first and second cavities, respectively, and maintain a first gas pressure within the first and second cavities.

At 710, one or more second etch processes may be optionally performed to an upper surface of the capping substrate. The one or more second etch processes etch completely through the capping substrate, which separates the capping substrate into two or more portions that are isolated from one another by trenches formed by the one or more second etch processes. The two or more portions include an external connection portion, which forms an electrical connection from the device substrate to external circuitry. The two or more portions also include the a cap portion, wherein the first and second cavities are formed.

At 712, a gas pressure within the second cavity is changed to a second gas pressure, which is different from the first gas pressure.

FIGS. 8A-8F illustrate some embodiments of a series of cross-sectional views that collectively depict formation of a semiconductor device. Although FIGS. 8A-8F are described in relation to the method 700, it will be appreciated that the structures disclosed in FIGS. 8A-8F are not limited to the method 700, but instead may stand alone as structures independent of the method 400. Similarly, although the method 700 is described in relation to FIGS. 8A-8F, it will be appreciated that the method 700 is not limited to the structures disclosed in FIGS. 8A-8F, but instead may stand alone independent of the structures disclosed in FIGS. 8A-8F.

Figure 8A:
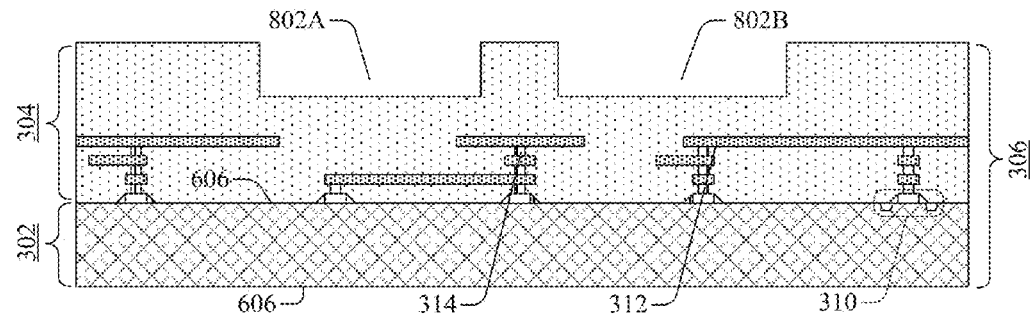
FIGS. 8A-8F illustrate a series of some embodiments of cross-sectional views that collectively depict formation of a semiconductor device with multiple MEMS cavities.

FIG. 8A illustrates a cross-sectional view corresponding to act 802. As shown in FIG. 8A, a processed substrate 306 is provided, which has been prepared through one or more fabrication processes. For example, the processed substrate 306 includes one or more active elements 310. A series of metallization planes 312 and via interconnects 314 connect to the one or more active elements 310. The processed substrate 306 includes a semiconductor substrate 302, and an IMD material 304 formed over an upper surface of the semiconductor substrate 302. First and second substrate cavities 802A, 802B are formed in a top portion of the IMD material 304 corresponding to first and second MEMS devices that will be subsequently positioned over the first and second substrate cavities 802A, 802B. In some embodiments, the first and second substrate cavities 802A, 802B are formed by one or more of a wet etching process or a dry etching process.

Figure 8B:
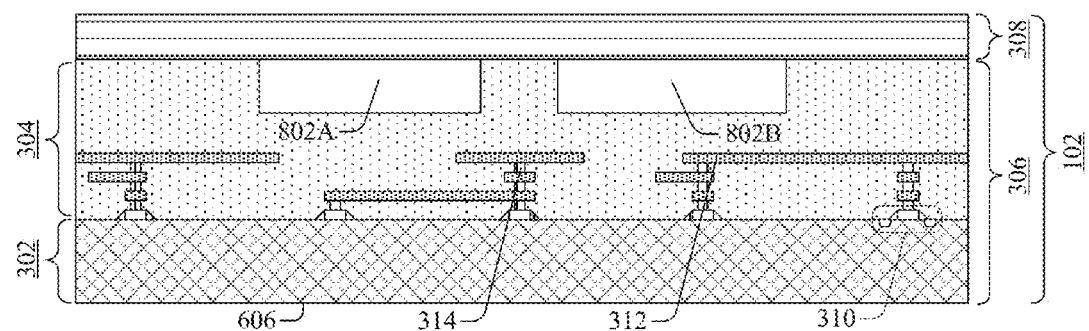

FIG. 8B illustrates a cross-sectional view corresponding to act 802. As shown in FIG. 8B, a MEMS substrate 308 has been bonded to the processed substrate 306 to form a device substrate 102. For example, the MEMS substrate 308 is bonded to the processed substrate 306 by a fusion bonding process at interface 602. In some embodiments, a fusion bonding is achieved between the IMD material 304 comprising $SiO_2$ and the MEMS substrate 308 comprising Si. In some embodiments, the MEMS substrate 308 is thinned down to reduce the thickness thereof after fusion bonding with the processed substrate 306

Figure 8C:
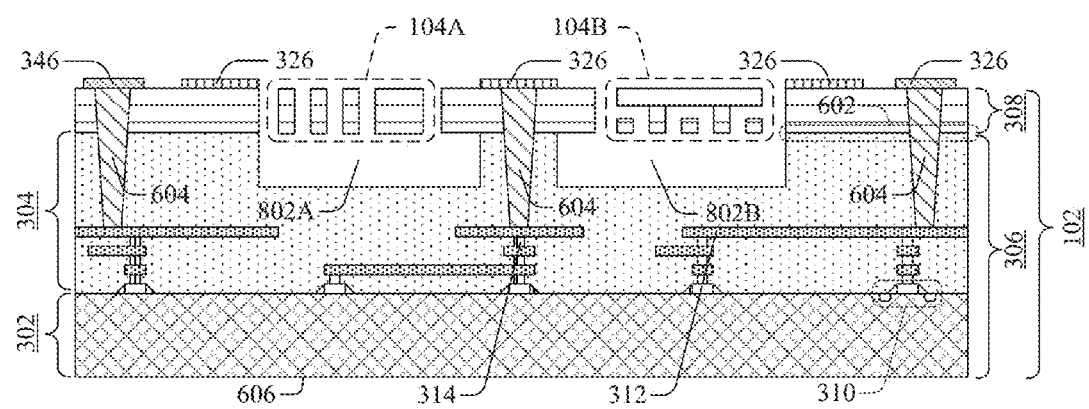

In FIG. 8C, which corresponds to act 802, first and second MEMS devices 104A, 104B, bonding materials 326, bottom pads 346 (e.g., Al, Cu, etc.), and TSVs 604 have been formed. The bonding materials 326 are used to form a hermetic seal between the MEMS substrate 308 and a capping structure that will be later positioned over the device substrate 102. The bottom pads 346 improve an electrical connection between the TSVs 604 and the MEMS substrate 308. To form the TSVs 604, trenches have been formed through the IMD material 304, which reach the metallization planes 312. The trenches have then been filled with metal (e.g., W) to form the TSVs 604, which are electrically connected to the metallization planes 312. The bonding materials 326 and bottom pads 346 have been formed from one or more layers (e.g., AlCu), which has been deposited over the MEMS substrate 308 and patterned. The first and second MEMS devices 104A, 104B have been formed from the MEMS substrate 308 by various processes including photolithography and etching processes.

Figure 8D:
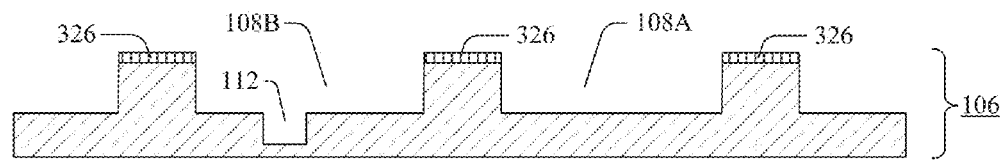

FIG. 8D illustrates a cross-sectional view corresponding to acts 704-706. As shown in FIG. 8D, a capping structure 106 has been prepared. In some embodiments, the capping structure 106 is prepared from a silicon capping substrate that has been subjected to a first etch to form first and second cavities 108A, 108B (act 704 of method 700). In some embodiments, bonding materials 326 are formed on portions of the capping structure 106 to form a hermetic seal with the device substrate 102. The capping structure has been further prepared by performing a second etch to form a recess 112 within a surface of the second cavity 108B (act 706 of method 700).

Figure 8E:
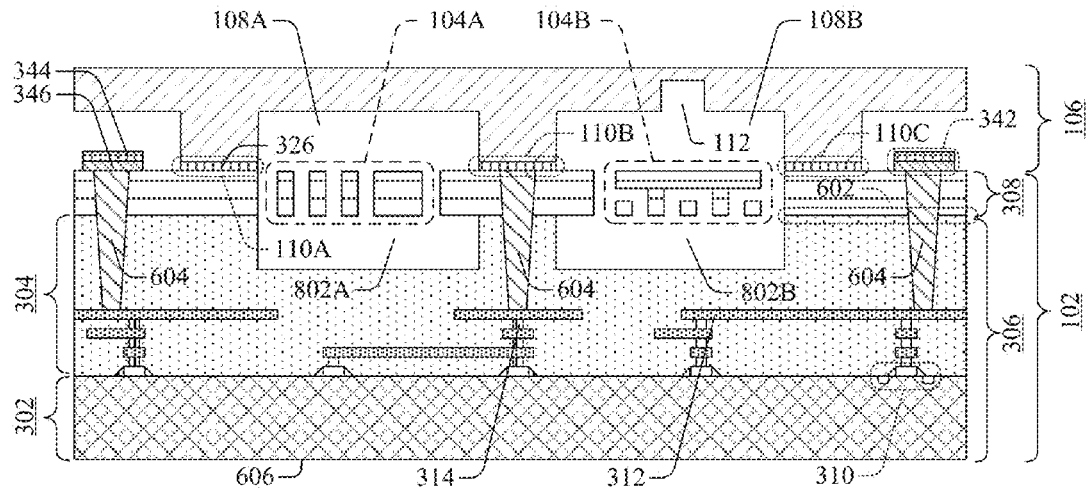

In FIG. 8E, which corresponds to act 708, the capping structure 106 has been flipped over and bonded to the device substrate 102. For example, the bonding materials 326 of the capping structure 106 are bonded by a eutectic bonding process to the corresponding bonding materials 326 of the device substrate 102, such that the device substrate 102 and the capping structure 106 are physically and electrically connected through the bonding materials 326 and the TSVs 604. Upon bonding, the first and second substrate cavities 802A, 802B become part of the first and second cavities 108A, 108B. In some embodiments, the capping structure 106 is thinned down to remove a partial thickness after being bonded to the device substrate 102.

In some embodiments, the eutectic bond 328 includes a semiconductor-to-metal bonding between a semiconductor material and a metal material. In some embodiments, the semiconductor material includes at least one of Ge, Si, SiGe, or another semiconductor material. In some embodiments, the metal material includes at least one of Al, Cu, Ti, Ta, Au, Ni, Sn, or another metal. Another example of eutectic bonding is a metal-to-metal bonding between two metal materials each including at least one of Al, Cu, Ti, Ta, Au, Ni, Sn, or another metal. The materials to be bonded are pressed against each other in an annealing process to form an eutectic phase of the materials. For example, a eutectic binding between Ge and Al is formed at an annealing temperature in a range from 400° C. to 450° C.

Figure 8F:
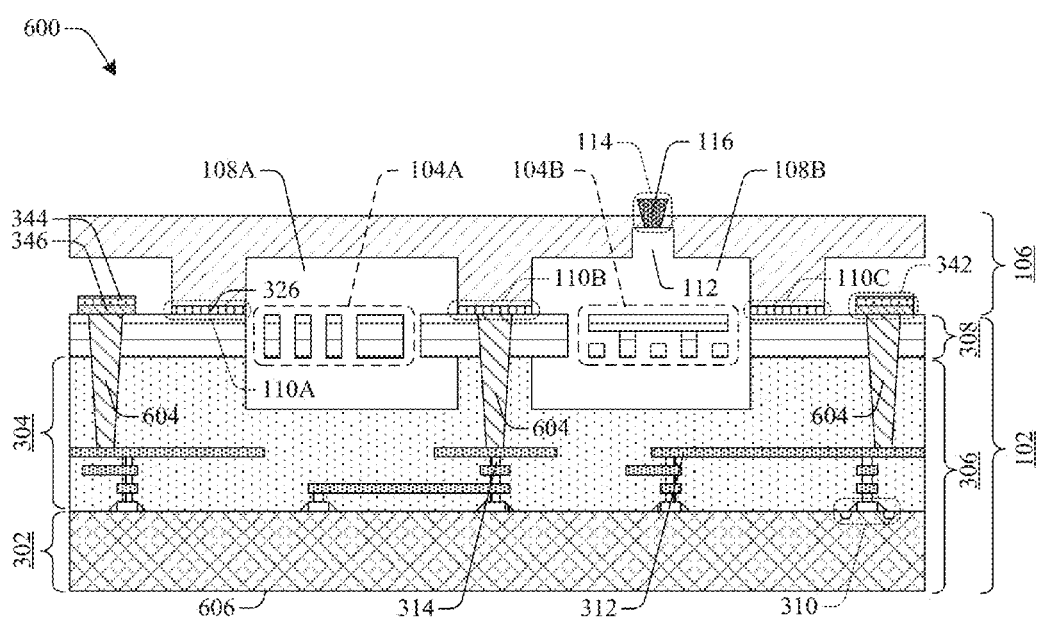

In FIG. 8F, which corresponds to act 712, a vent 114 has been formed in the upper surface of the second cavity 108B. Upon formation of the vent 114, the pressure of the ambient environment surrounding the capping structure 106 and the device substrate 102 is changed to the second gas pressure, and gas diffusion is allowed to occur through the vent 114 between the ambient environment and the second cavity 108B. Once the gas diffusion reaches a steady-state condition, the pressure within the second cavity 108B is equal to the second gas pressure. A conformal layer of lid material 524 has been disposed and patterned to form a lid 116, which creates a hermitic seal to maintain the second cavity 108B at the second gas pressure.

In some embodiments, the capping structure 106 is etched to form external connection portions (optional act 710 of method 700), which are isolated from the rest of the capping structure. The external connection portions form connections between the device substrate 102 and the external circuitry.

Figure 9A:
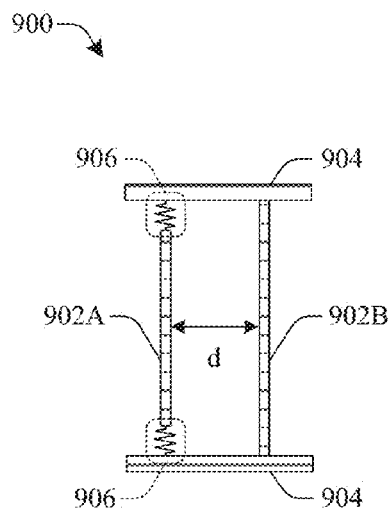
FIGS. 9A-9B illustrate some embodiments of a MEMS accelerometer.
Figure 9B:
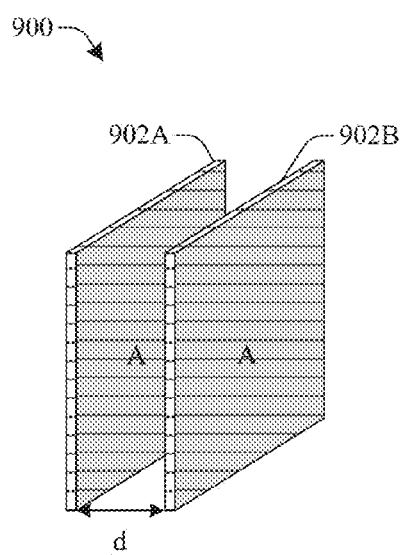

FIGS. 9A-9B illustrate some embodiments of a capacitive MEMS accelerometer 900. It is appreciated that the capacitive MEMS accelerometer 900 is one possible type of MEMS accelerometer that is included for illustration purposes, and does not impose any limitation on the type of MEMS accelerometer utilized in conjunction with the embodiments of the present disclosure. The capacitive MEMS accelerometer 900 includes first and second conductive plates 902A, 902B, which are oriented parallel to one another. A capacitance of the capacitive MEMS accelerometer 900 is proportional to an area (A) of the first and second conductive plates 902A, 902B, as well as a distance (d) between them. Therefore, the capacitance changes if the distance (d) between the first and second conductive plates 902A, 902B changes. The second conductive plate 902B is rigidly attached to an assembly 904. The first conductive plate 902A is elastically attached to the assembly 904 by springs 906.

When the capacitive MEMS accelerometer 900 undergoes a linear acceleration event along the direction parallel to d, the second conductive plate 902B moves with the assembly 904, while the first conductive plate 902A initially does not. Instead, the springs 906 expand, allowing the first conductive plate 902A to initially remain stationary. The resulting change in capacitance caused by the movement of the first conductive plate 902A relative to the second conductive plate 902B can be used to determine a magnitude and direction of the acceleration.

Upon completion of the linear acceleration event, the first conductive plate 902A will oscillate about an equilibrium position until a damping effect of air friction slows and eventually stops it. It is therefore desirable in some embodiments to tune the damping effects of the air friction to efficiently detect a first linear acceleration event, while damping oscillation from the first linear acceleration event in enough time to detect a subsequent linear acceleration event. The damping effects of the air friction can be tuned by a gas pressure of a gas surrounding the capacitive MEMS accelerometer 900. In some embodiments, a gas pressure on an order of about 1 atmosphere can achieve effective damping. It is further appreciated that the exemplary capacitive MEMS accelerometer 900 of FIGS. 9A-9B is a "1-axis" accelerometer. In order to detect a complete range of linear accelerations in a three-dimensional (3D) space, three or more orthogonally oriented capacitive MEMS accelerometers 900 can be utilized together to form a "3-axis" accelerometer.

Figure 10A:
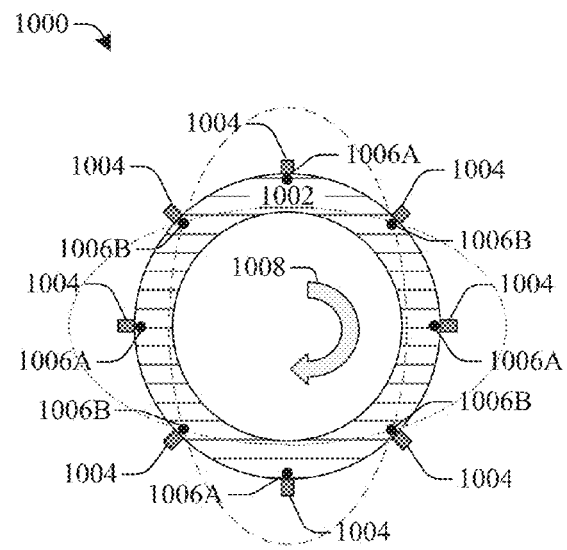
FIGS. 10A-10B illustrate some embodiments of a MEMS gyroscope.
Figure 10B:
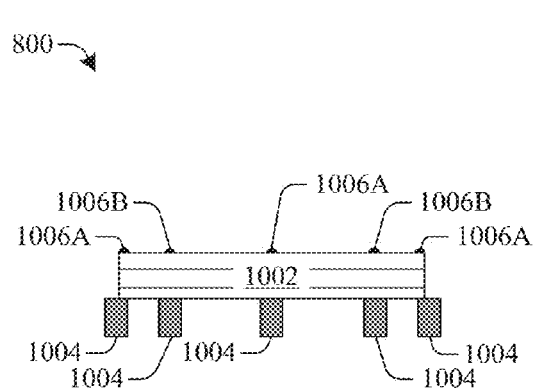

FIGS. 10A-10B illustrate some embodiments of a ring MEMS gyroscope 1000. FIG. 10A illustrates a top view of the ring MEMS gyroscope 1000. FIG. 10B illustrates a cross-sectional view of the ring MEMS gyroscope 1000. It is appreciated that the ring MEMS gyroscope 1000 is one possible type of MEMS gyroscope that is included for illustration purposes, and does not impose any limitation on the type of MEMS gyroscope utilized in conjunction with the embodiments of the present disclosure. The ring MEMS gyroscope 1000 includes an annular ring 1002. The annular ring 1002 is supported in free-space by spokes 1004, which are attached at first and second nodes 1006A, 1006B.

During operation of the ring MEMS gyroscope 1000, the annular ring 1002 vibrates at a resonant frequency. Actuators or transducers (not shown) are attached to the upper surface of the annular ring 1002 at the first and second nodes 1006A, 1006B, and are electrically connected to bond pads on the spokes 1004. The actuators or transducers drive the annular ring 1002 into a mode of vibration at resonance. When the ring MEMS gyroscope 1000 is in a resonant state, and not subjected to any angular acceleration, first nodes 1006A move radially, while the second nodes 1006B remain stationary. However, when the ring MEMS gyroscope 1000 is subjected to an angular acceleration event (e.g., rotation 1008), the Coriolis force changes the resonate state of the annular ring 1002, which causes the second nodes 1006B to move. By detecting the relative movement first and second nodes 1006A, 1006B, the angular acceleration of the ring MEMS gyroscope 1000 can be measured.

Unlike the capacitive MEMS accelerometer 900, which oscillates during a linear acceleration event, the annular ring 1002 of the ring MEMS gyroscope 1000 is maintained in a resonant state while in operation. As such, the damping effects of air friction are not desired, as they require additional power from the actuators or transducers to drive the annular ring 1002 into the resonant state. It is therefore desirable in some embodiments to negate the damping effects of the air friction to efficiently detect an angular acceleration event by sealing the ring MEMS gyroscope 1000 in a vacuum. The vacuum reduces a Q-factor of the ring MEMS gyroscope 1000 by suppressing energy dissipation due to air friction.

FIGS. 11A-11F illustrate cross-sectional views of various alternate embodiments of a disclosed semiconductor device having multiple MEMS cavities.

Figure 11A:
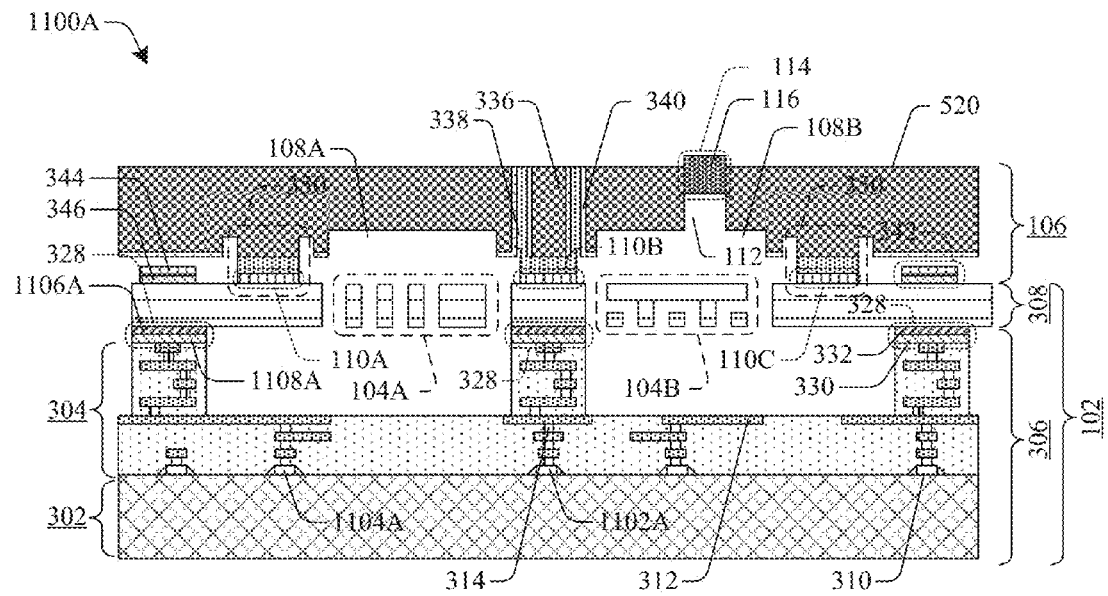
FIGS. 11A-11F illustrate cross-sectional views of various embodiments of a semiconductor device with multiple MEMS cavities.

FIG. 11A illustrates a cross-sectional view of some embodiments of a semiconductor device 1100A, in which locations of the pillar 336 and the guard rings 350 are reversed compared to the semiconductor device 300. As a result, the pillar 336 provides an external connection between active element 1102A and external circuitry through the metallization planes 312 and the via interconnects 314. In a similar manner, active element 1104A is connected to first MEMS device 104A. The IMD material 304 of the processed substrate 306 is bonded to the MEMS substrate 308 by the eutectic bonds 328. In some embodiments, the eutectic bonds 328 include a semiconductor-to-metal bonding between a semiconductor material 1106A and a metal material 1108A. The eutectic bonds 328, which physically and electrically connect the processed substrate 306 to the MEMS substrate 308.

Figure 11B:
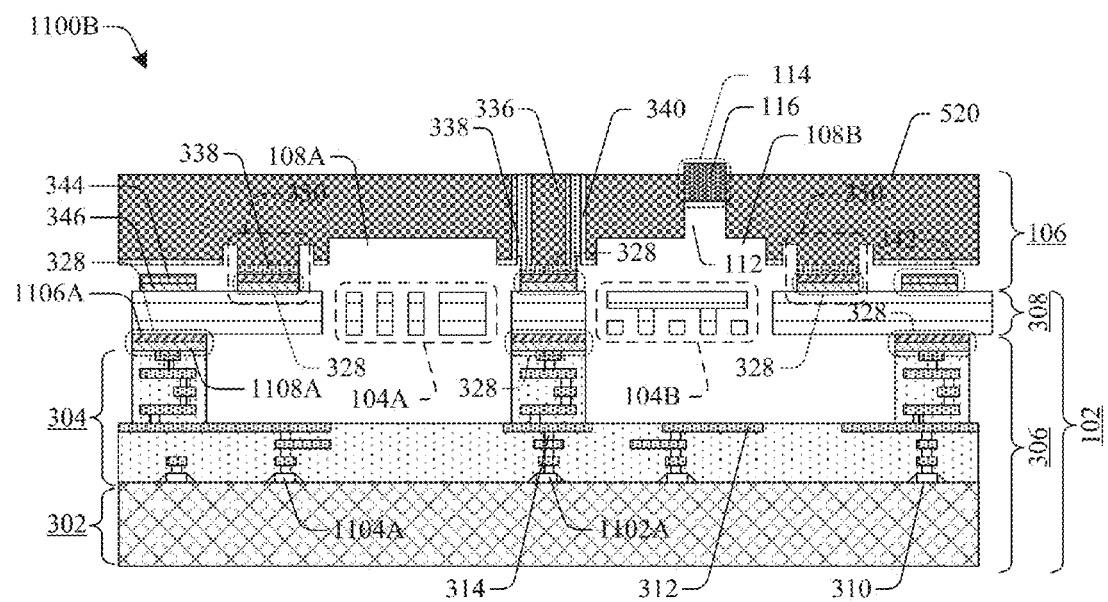

FIG. 11B illustrates a cross-sectional view of some embodiments of a semiconductor device 1100B, in which the bonding materials 326 of the semiconductor device 300 are replaced by eutectic bonds 328, which include bottom bond pads 330 (e.g., Al, Cu, Ti, Ta, Au, Ni, Sn) on an upper surface of the IMD material 304, and the top bond pads 332 (e.g., Ge, Si) on the silicon 338 of the capping structure 106.

Figure 11C:
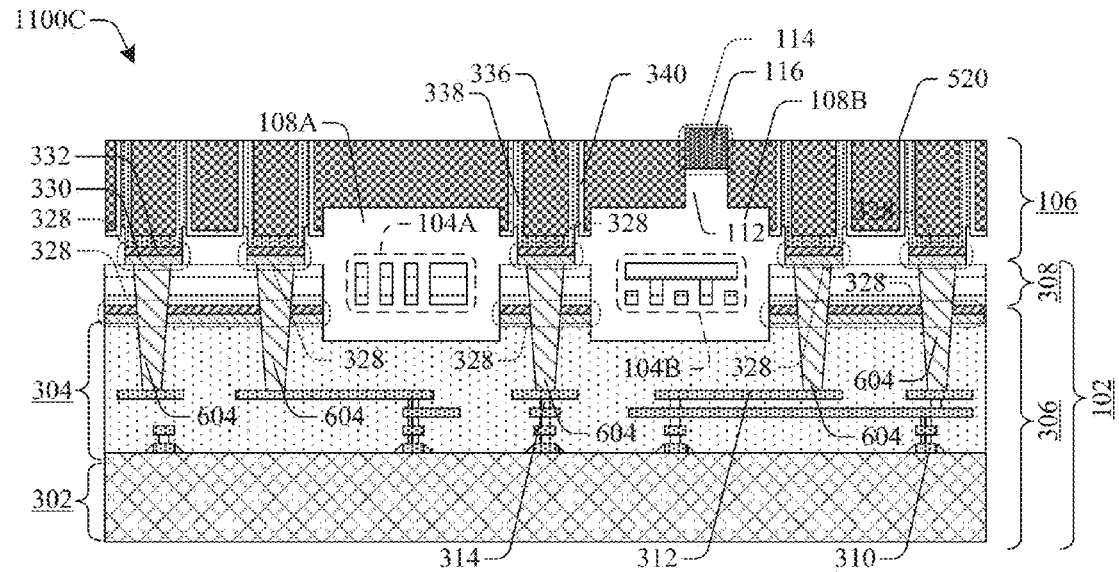

FIG. 11C illustrates a cross-sectional view of some embodiments of a semiconductor device 1100C, in which connections between the active and passive elements of the semiconductor substrate 302 and the MEMS substrate 308, and/or external circuitry (i.e., through pillars 336) are formed by TSVs 604, which are connected to the metallization planes 312 and via interconnects 314 of the device substrate 102.

Figure 11D:
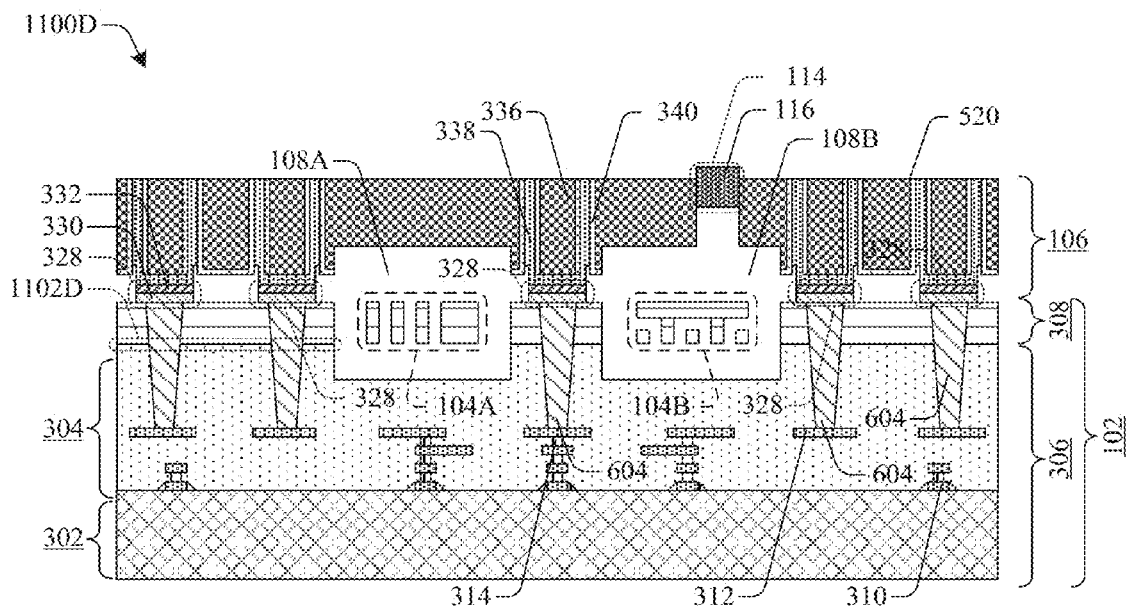

FIG. 11D illustrates a cross-sectional view of some embodiments of a semiconductor device 1100D, in which the IMD material 304 of the processed substrate 306 and the MEMS substrate 308 are bonded by a fusion bond 1102D. An example of fusion bonding process involves pressing the processed substrate 306 and the MEMS substrate 308 against each other and performing an annealing process to cause the processed substrate 306 and the MEMS substrate 308 to be bonded together due to atomic attraction forces. The fusion bonding process is applicable for $SiO_2$ to Si bonding, Si to Si bonding, and other suitable bonding. In one or more embodiments, $SiO_2$ to Si fusion bonding occurs between the IMD material 304 (e.g., $SiO_2$) and the MEMS substrate 308 (e.g., Si).

Figure 11E:
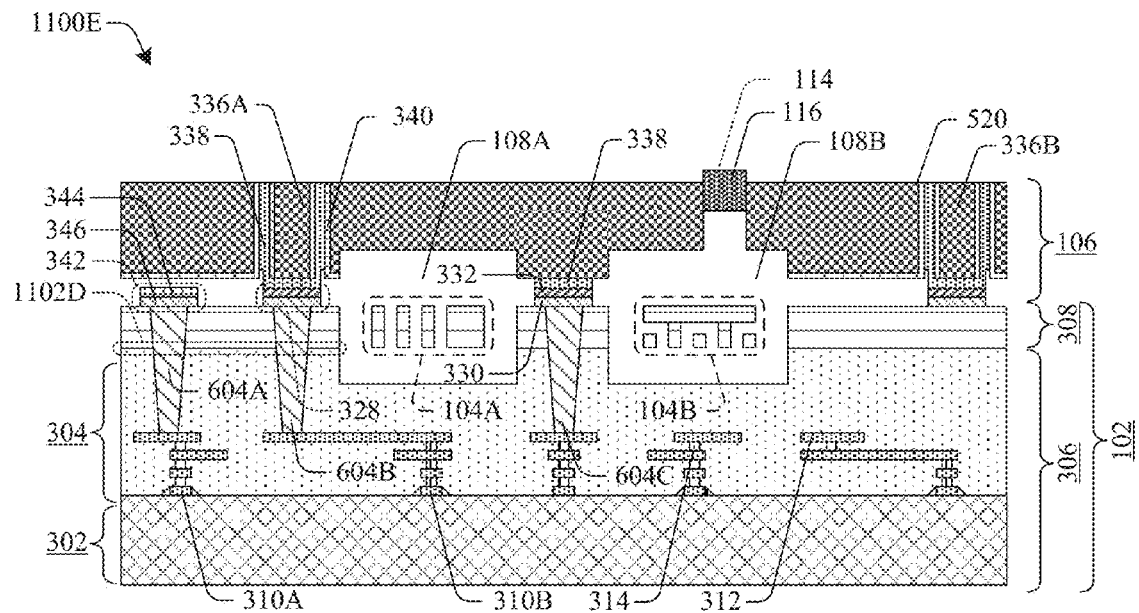

FIG. 11E illustrates a cross-sectional view of some embodiments of a semiconductor device 1100E, in which a first active element 310A is connected to the MEMS substrate 308 (e.g., the first or second MEMS devices 104A, 104B) by a first TSV 604A. Second active element 310B is connected to external circuitry through TSV 604B and pillar 336A. The MEMS substrate (e.g., the first or second MEMS devices 104A, 104B) are connected to external circuitry by pillar 336B.

Figure 11F:
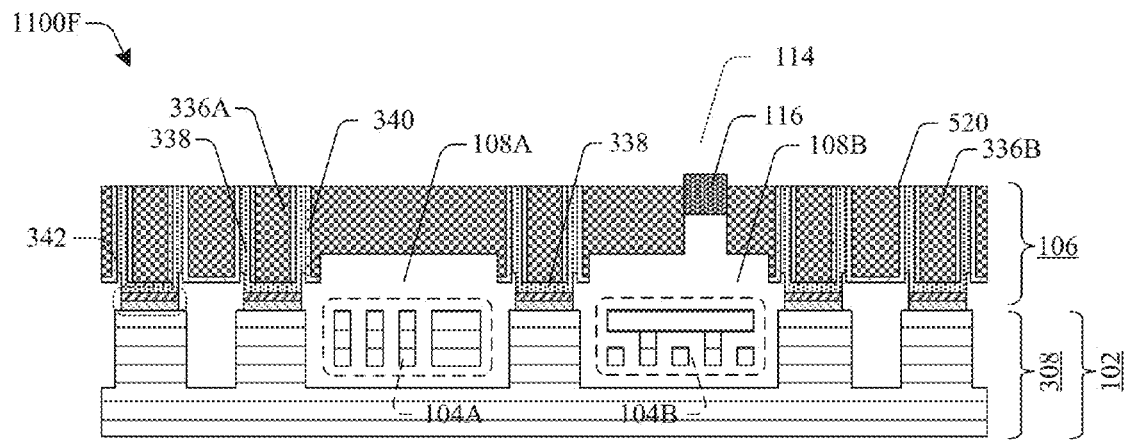

FIG. 11F illustrates a cross-sectional view of some embodiments of a semiconductor device 1100F including a device substrate 102, but no processed substrate 306. The semiconductor device 1100F contains no active or passive elements. Internal connections are made within the MEMS substrate 308. Connections to external circuitry (e.g., from the first and second MEMS devices 104A, 104B) are made through the pillars 336 of the capping structure 106.

FIGS. 12A-12D illustrate cross-sectional views of various alternate embodiments of a disclosed semiconductor device having multiple MEMS cavities.

Figure 12A:
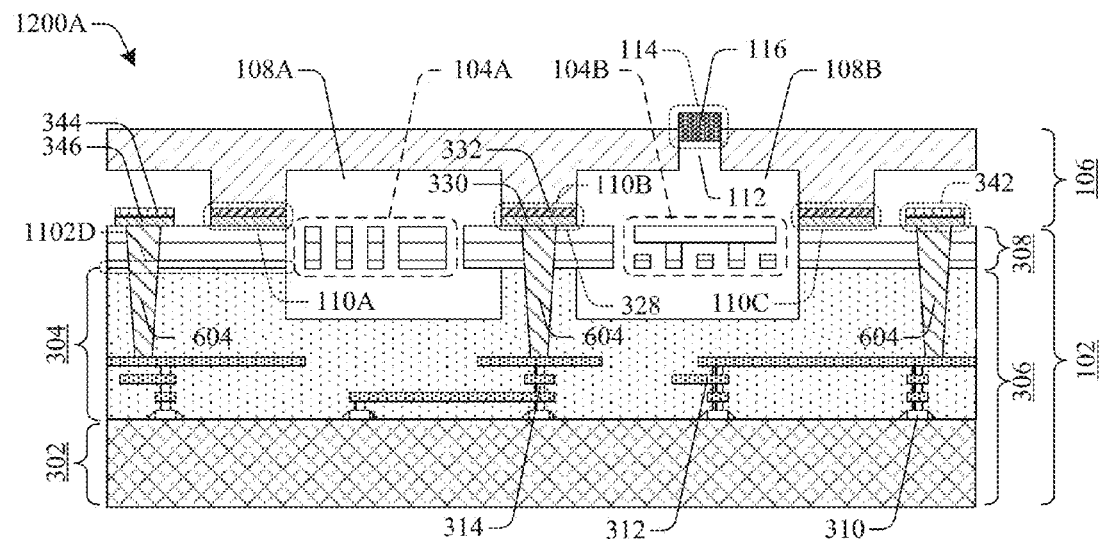
FIGS. 12A-12D illustrate cross-sectional views of various embodiments of a semiconductor device with multiple MEMS cavities.

FIG. 12A illustrates a cross-sectional view of some embodiments of a semiconductor device 1200A, in which first through third hermetic seals 110A-110C have been formed from eutectic bonds 328. The processed substrate 306 has been bonded to the MEMS substrate 308 with a fusion bond.

Figure 12B:
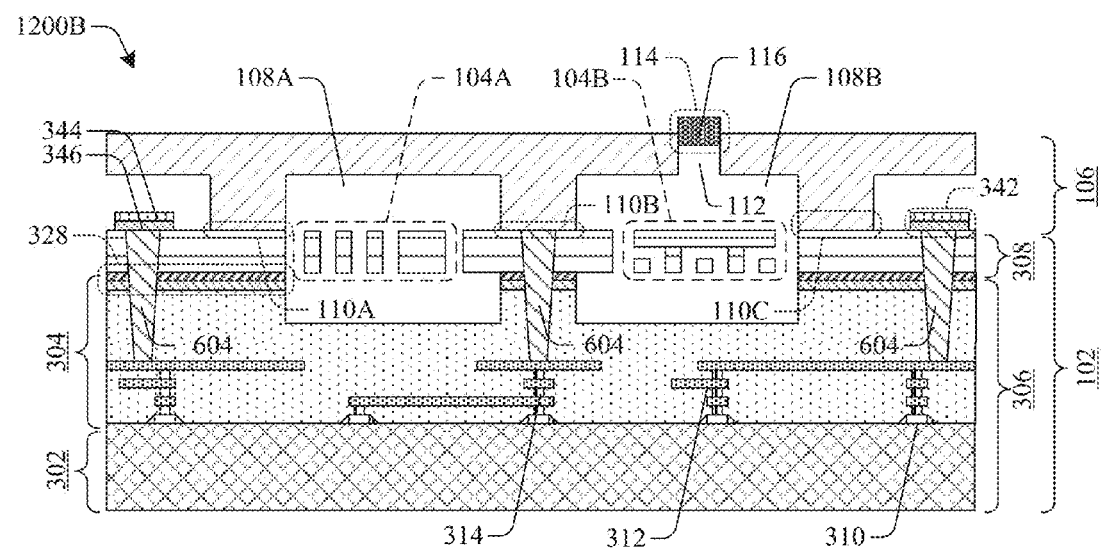

FIG. 12B illustrates a cross-sectional view of some embodiments of a semiconductor device 1200B, in which the bond type at a first interface between the processed substrate 306 and the MEMS substrate 308, and at a second interface between the MEMS substrate 308 and the capping structure 106 have been reversed. The first through third hermetic seals boundaries 110A-110C have been formed from fusion bonds. The processed substrate 306 has been bonded to the MEMS substrate 308 with eutectic bonds 328. It is appreciated that additional embodiments including all possible combinations of fusion and eutectic bonding at the first and second interfaces are within the contemplated scope of the present disclosure.

Figure 12C:
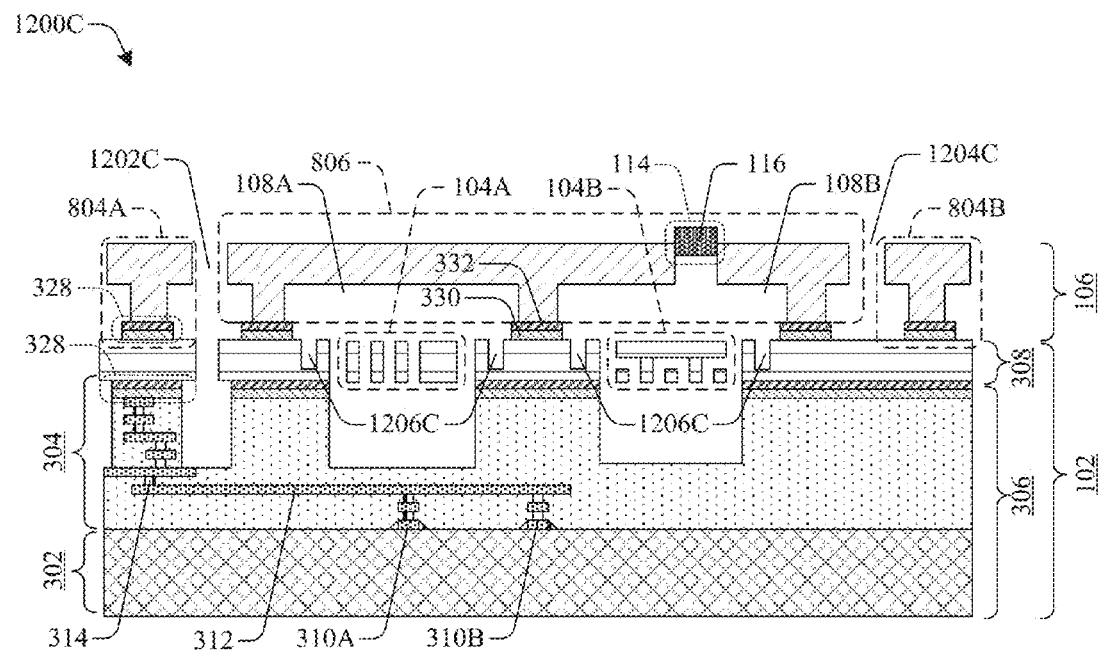

FIG. 12C illustrates a cross-sectional view of some embodiments of a semiconductor device 1200C, in which the capping layer 106 has been etched to form first and second trenches 1202C, 1204C. The first and second trenches 1202C, 1204C separate the capping structure 106 into first and second external connection portions 804A, 804B, and a cap portion 806, which are not in contact with one another. Additionally, the first trench 1202C extends through the MEMS substrate 308 and into the IMD material 304, which forms a conductive path directly from first and second active elements 310A, 310B, through the metallization planes 312, via interconnects 314, the first external connection portion 804A of the capping structure 106, and to external circuitry. The metallization planes 312 and the via interconnects 314 also form connections from first and second active elements 310A, 310B to the MEMS substrate 308 (e.g., the first and second MEMS devices 104A, 104B) through eutectic bonds 328. The MEMS substrate (e.g., the first and second MEMS devices 104A, 104B) form connections to external circuitry through the second external connection portion 804B of the capping structure 106.

The MEMS substrate 308 of the semiconductor device 1200C includes spill trenches 1206C in the formed between the eutectic bonds 328 (hermetic seals) and the first or second MEMS device 104A, 104B. The spill trenches 1206C are configured to capture excess bonding material (i.e., from the bottom bond pad 330 and/or the top bond pad 332 of the eutectic bonds 328), which may "squirt out" from the eutectic bonds 328 when the capping structure 106 and the device substrate 102 are pressed together during the eutectic bonding process. The spill trenches 1206C prevent damage and/or contamination to the first or second MEMS devices 104A, 104B during the eutectic bonding process. Consequently, in some embodiments, at least one of the spill trenches 1206C is filled, at least partially, with bonding material.

Figure 12D:
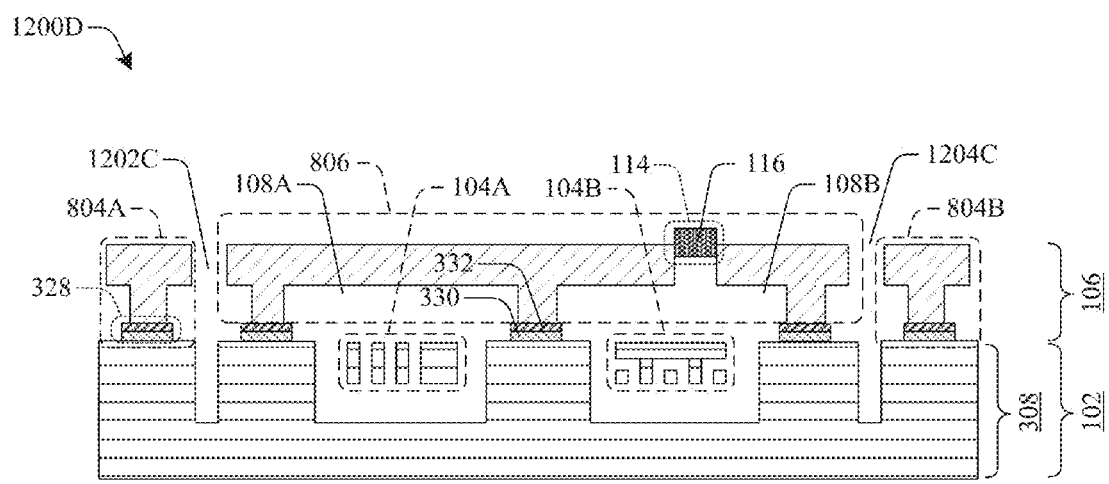

FIG. 12D illustrates a cross-sectional view of some embodiments of a semiconductor device 1200D including a device substrate 102, but no processed substrate 306. The semiconductor device 1200D contains to active or passive elements, MEMS elements (e.g., the first and second MEMS devices 104A, 104B), internal connections within the MEMS substrate 308, and connections to external circuitry through the first and second external connection portions 804A, 804B capping structure 106.

Figure 13A:
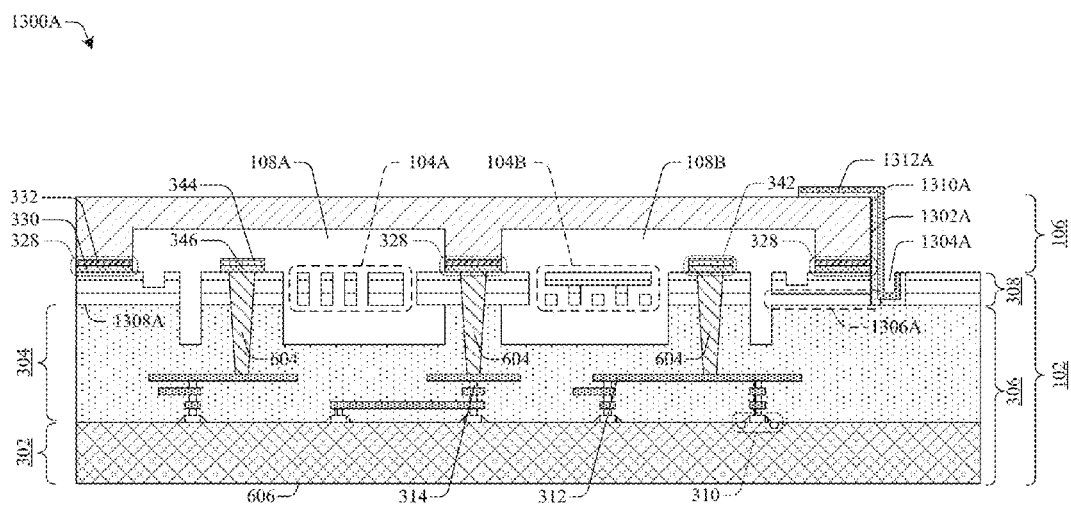
FIGS. 13A-13B illustrate cross-sectional views of various embodiments of a semiconductor device with multiple MEMS cavities.
Figure 13B:
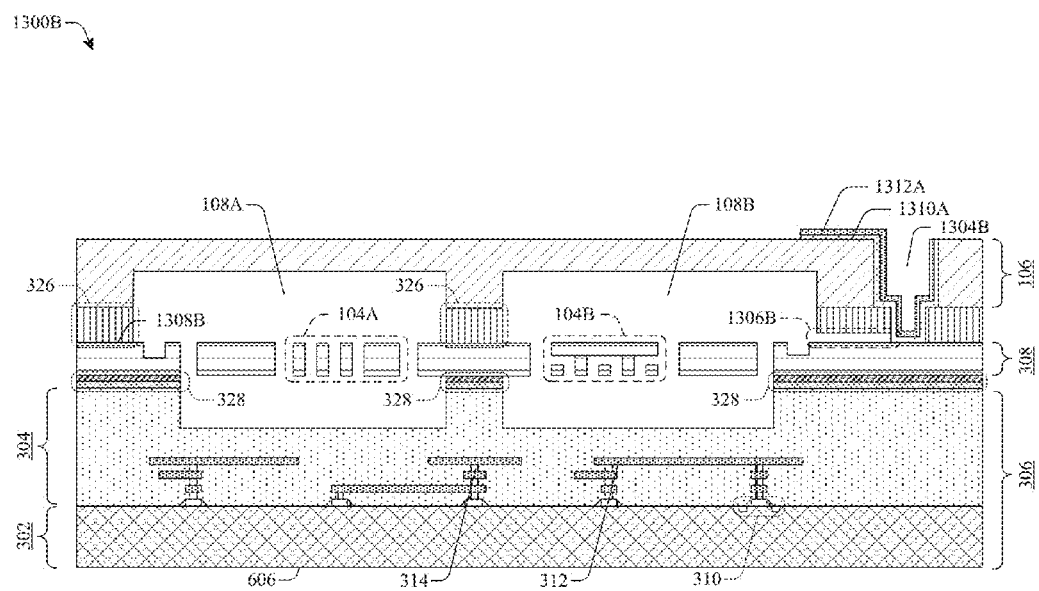

FIGS. 13A-13B illustrate cross-sectional views of various embodiments of a semiconductor device with multiple MEMS cavities.

FIG. 13A illustrates a cross-sectional view of some embodiments of a semiconductor device 1300A, in which the MEMS substrate 308 has been etched adjacent a sidewall 1302A of the capping layer 106 to form a trench 1304A. In alternative embodiments, the trench 1304A can be etched through the capping layer 106. A shallow lateral trench 1306A is arranged at a first bonding interface 1308A 306 and 308 between the processed substrate 306 and the MEMS substrate 308. For the embodiments of the semiconductor device 1300A, the first bonding interface 1308A includes eutectic bonds 328, which include a bottom bond pad 330 (e.g., Al, Cu, Ti, Ta, Au, Ni, Sn) and a top bond pad 332 (e.g., Ge, Si). In other embodiments, the first bonding interface 1308A includes fusion bonds formed from one or more bonding materials 326 (e.g., $SiO_2$). The trench 1304A and the shallow lateral trench 1306A combine to form a vent, which permits a second gas pressure within the second cavity 108B to be independently adjusted relative to a first gas pressure within the first cavity 108A.

The trench 1304A and the shallow lateral trench 1306A are patterned before bonding. After the second gas pressure within the second cavity 108B is adjusted, the vent is "capped" by a first seal material 1310A, which reduces a size of the trench 1304A. In some embodiments, the first seal material 1310A includes an oxide (e.g., $SiO_2$), which is disposed along the by a CVD process such as along the sidewall 1302A of the capping layer 106 and trench 1304A, and along the bottom of the trench 1304A. A second seal material 1312A is then disposed over the first seal material 1310A to achieve hermetic seal. In some embodiments, the second seal material 1312A includes a metal (e.g., Al, Cu, etc.).

FIG. 13B illustrates a cross-sectional view of some embodiments of a semiconductor device 1300B, which is substantially similar to the semiconductor device 1300A, in which a trench 1304B and a shallow lateral trench 1306B form a vent. However, the shallow lateral trench 1306B is formed at a second bonding interface 1308B between the processed capping layer 106 and the MEMS substrate 308. Additionally, the shallow lateral trench 1306B is formed within a bonding material 326, which forms a fusion bond between a lower surface of the capping structure 106 and MEMS substrate 308. In other embodiments, the shallow lateral trench 1306B is formed within a bottom surface of the bonding material 326 prior to bonding. In other embodiments, the second bonding interface 1308B is formed by fusion bonds.

Therefore, the present disclosure is directed to multiple MEMS devices that are integrated together on a single substrate. A device substrate comprising first and second micro-electro mechanical system (MEMS) devices is bonded to a capping structure. The capping structure comprises a first cavity arranged over the first MEMS device and a second cavity arranged over the second MEMS device. The first cavity is filled with a first gas at a first gas pressure. The second cavity is filled with a second gas at a second gas pressure, which is different from the first gas pressure. A recess is arranged within a lower surface of the capping structure. The recess abuts the second cavity. A vent is arranged within the capping structure. The vent extends from a top of the recess to the upper surface of the capping structure. A lid is arranged within the vent and configured to seal the second cavity.

Some embodiments relate to a semiconductor device, comprising a capping structure bonded to a device substrate. The device substrate comprises first and second micro-electro mechanical system (MEMS) devices. The capping structure comprises a first cavity arranged over the first MEMS device and a second cavity arranged over the second MEMS device. The first cavity is at a first gas pressure. The second cavity is at a second gas pressure, which is different from the first gas pressure.

Other embodiments relate to a semiconductor device, comprising a capping structure bonded to a device substrate. The device substrate comprises first and second micro-electro mechanical system (MEMS) devices. The capping structure comprises a first cavity arranged over the first MEMS device, and a second cavity arranged over the second MEMS device. A first hermetic seal is formed between a first border of the first cavity and the surface of the device substrate, which encases the first MEMS device within the first cavity at a first gas pressure. A second hermetic seal is formed between a second border of the second cavity and the surface of the device substrate, which encases the second MEMS device within the second cavity at a second gas pressure, which is different from the first gas pressure. A recess is formed within the capping structure in an upper surface of the second cavity. A vent is formed within the recess and through the capping substrate. The vent and the recess collectively connect the second cavity to an ambient environment that surrounds the semiconductor device. A lid is formed within the vent and over an upper surface of the capping structure, which forms a hermitic seal with sidewalls of the vent and the upper surface of the capping structure to seal the second cavity.

Still other embodiments relate to a method, comprising providing a device substrate and a capping structure. The device substrate comprises first and second MEMS devices. The capping structure comprises first and second cavities. The method further comprises bonding the capping structure to the device substrate, such that the first cavity arranged over the first MEMS device and a second cavity arranged over the second MEMS device. A first gas pressure is established within the first and second cavities. The pressure within the second cavity is changed to a second gas pressure, which is different from the first gas pressure.

While methods 200, 400, and 700 have been described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a device substrate comprising first and second microelectro mechanical system (MEMS) devices;
    a capping structure bonded to the device substrate, the capping structure comprising a first cavity arranged over the first MEMS device and a second cavity arranged over the second MEMS device, wherein the first cavity is at a first gas pressure, and wherein the second cavity is at a second gas pressure, which is different from the first gas pressure;
    a recess arranged within a lower surface of the capping structure, which abuts the second cavity and which extends from the lower surface of the capping structure to a top surface of the recess which is vertically spaced between the lower surface and an upper surface of the capping structure;
    a vent arranged between vent sidewalls of the capping structure, wherein the vent sidewalls are coupled to the top surface of the recess, wherein the vent extends to the upper surface of the capping structure, and wherein the vent is narrower than the recess; and
    a lid arranged within the vent and configured to seal the second cavity.

2. The semiconductor device of claim 1, wherein the lid is arranged over a first portion of the upper surface of the capping structure in a vicinity of the vent, and wherein the lid exposes a second portion of the upper surface of the capping structure.

3. The semiconductor device of claim 1, wherein a bond between the capping structure and the device substrate comprises:
    a first hermetic seal, which surrounds the first cavity at an interface between a second lower surface of the capping structure and an upper surface of the device substrate, wherein the first hermetic seal prevents gas from diffusing from the first cavity; and
    a second hermetic seal, which surrounds the second cavity at a second interface between the second lower surface of the capping structure and the upper surface of the device substrate, wherein the second hermetic seal prevents gas from diffusing from the second cavity.

4. The semiconductor device of claim 3, wherein the first or second hermetic seal is formed from bonding materials including a semiconductor material and a metal material, which abut one another.

5. The semiconductor device of claim 1, wherein the device substrate further comprises:
    a processed substrate comprising at least one conductive layer, and
    a MEMS substrate comprising the first and second MEMS devices, the MEMS substrate bonded to the processed substrate, wherein the first or second MEMS device are electrically connected to the at least one conductive layer.

6. The semiconductor device of claim 1,
    wherein the capping structure comprises a conductive pillar that extends from a second lower surface of the capping structure, through the capping structure, to the upper surface of the capping structure; and
    wherein the conductive pillar is surrounded and isolated from a remainder of the capping structure by a trench, which is filled with a dielectric material.

7. The semiconductor device of claim 1, wherein the first and second cavities extend into an upper surface of the device substrate.

8. The semiconductor device of claim 1, wherein the recess contacts recess sidewalls of the capping structure consisting of a first material, and wherein the vent contacts the vent sidewalls of the capping structure consisting of the first material.

9. A semiconductor device, comprising:
    a device substrate comprising first and second microelectro mechanical system (MEMS) devices;
    a capping structure arranged over the device substrate and comprising a first cavity arranged over the first MEMS device and a second cavity arranged over the second MEMS device, wherein the first cavity is at a first pressure, and wherein the second cavity is at a second pressure, which is different from the first pressure;
    a vent extending from a location in communication with the second cavity to an upper surface of the capping structure facing away from the device substrate;
    a lid arranged within the vent and protruding outward from the upper surface of the capping structure; and
    a silicon pillar extending from a lower surface of the capping structure, through the capping structure, to the upper surface of the capping structure;
    a polysilicon layer laterally surrounding the silicon pillar and vertically extending from the lower surface of the capping structure to the upper surface of the capping structure; and
    an isolating material laterally separating the silicon pillar from the capping structure.

10. The semiconductor device of claim 9, further comprising:
    a recess that is wider than the vent and that is arranged within a second lower surface of the capping structure, wherein the vent extends from the recess to the upper surface of the capping structure.

11. The semiconductor device of claim 9, wherein the lid comprises silicon nitride, silicon oxy-nitride, oxide, photoresist, polyimide, amorphous carbon, polysilicon, amorphous silicon, or a metal.

12. The semiconductor device of claim 9, wherein the isolating material laterally separates the polysilicon layer from the silicon pillar and from the capping structure.

13. The semiconductor device of claim 9, wherein the device substrate comprises:
 a semiconductor substrate having one or more transistor devices; and
 a MEMs substrate separated from the semiconductor substrate by a dielectric structure comprising a plurality of metal interconnect layers.

14. A semiconductor device, comprising:
 a device substrate comprising first and second microelectro mechanical system (MEMS) devices;
 a capping structure arranged over the device substrate and comprising a first cavity arranged over the first MEMS device and a second cavity arranged over the second MEMS device, wherein the first cavity is at a first pressure, and wherein the second cavity is at a second pressure, which is different from the first pressure;
 a vent, extending from a location in communication with the second cavity to an upper surface of the capping structure facing away from the device substrate;
 a lid arranged within the vent;
 a pillar of capping structure material comprising pillar sidewalls that extend vertically from a lower surface of the capping structure to the upper surface of the capping structure; and
 an isolating material surrounding the pillar sidewalls and vertically extending from the lower surface to the upper surface of the pillar sidewalls, and laterally separating the pillar from the capping structure.

15. The semiconductor device of claim 14, further comprising:
 a polysilicon layer laterally surrounding the pillar of capping structure material and vertically extending from the lower surface of the capping structure to the upper surface of the capping structure.

16. The semiconductor device of claim 15, wherein the polysilicon layer separates a lower surface of the pillar of capping structure material from the device substrate.

17. The semiconductor device of claim 16,
 wherein the polysilicon layer has a first lower surface underlying the pillar of capping structure material, which is below a lower surface of the isolating material; and
 wherein the polysilicon layer has a second lower surface, laterally between the pillar of capping structure material and the capping structure, which is above the lower surface of the isolating material.

18. The semiconductor device of claim 14, wherein the pillar of capping structure material is laterally offset from the vent.

19. The semiconductor device of claim 14, wherein the pillar of capping structure material overlies a bonding material arranged between the device substrate and the capping structure.

20. The semiconductor device of claim 14, wherein the isolating material extends along the lower surface of the capping structure.

* * * * *